US 8,836,561 B2

(12) United States Patent
Kanagawa et al.

(10) Patent No.: US 8,836,561 B2
(45) Date of Patent: Sep. 16, 2014

(54) DIGITAL TO-ANALOG CONVERSION CIRCUIT

(71) Applicant: Sony Corporation, Tokyo (JP)

(72) Inventors: Norifumi Kanagawa, Kanagawa (JP); Yasuhide Shimizu, Fukuoka (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/025,254

(22) Filed: Sep. 12, 2013

(65) Prior Publication Data

US 2014/0104087 A1 Apr. 17, 2014

(30) Foreign Application Priority Data

Oct. 12, 2012 (JP) ................................. 2012-226748

(51) Int. Cl.
    *H03M 1/66* (2006.01)
(52) U.S. Cl.
    CPC ....................................... *H03M 1/66* (2013.01)
    USPC ............................ 341/144; 341/136; 341/153
(58) Field of Classification Search
    CPC ....... H03M 1/742; H03M 1/66; H03M 1/685; H03M 1/687; H03M 1/747; H03M 2201/3121; H03M 2201/3136; H03M 2201/644; H03M 1/745; H03M 2201/225; H03M 2201/8132
    USPC .................. 341/134–136, 144, 153
    See application file for complete search history.

(56) References Cited

U.S. PATENT DOCUMENTS

| | | | | |
|---|---|---|---|---|
| 5,148,164 A | * | 9/1992 | Nakamura et al. | 341/136 |
| 6,741,195 B1 | * | 5/2004 | Cho | 341/136 |
| 7,474,243 B1 | * | 1/2009 | Kuttner | 341/144 |
| 7,576,675 B1 | * | 8/2009 | Lee et al. | 341/144 |
| 7,679,538 B2 | * | 3/2010 | Tsang | 341/144 |
| 8,682,264 B2 | * | 3/2014 | Kurose | 455/91 |
| 2014/0104088 A1 | * | 4/2014 | Nagasawa et al. | 341/144 |

FOREIGN PATENT DOCUMENTS

JP     2010-263660 A     11/2010

* cited by examiner

*Primary Examiner* — Linh Nguyen
(74) *Attorney, Agent, or Firm* — Rader, Fishman & Grauer PLLC

(57) ABSTRACT

A D/A conversion circuit includes: current generation circuits each including a constant current source configured to generate a current, a first MOSFET connected to the constant current source and configured to control a supply destination of the current, a first gate control section configured to exclusively supply a first voltage and a second voltage to a gate of the first MOSFET, and a first discharge switch connected to the first gate control section and the gate of the first MOSFET, controlled to be turned on at the same time as the first gate control section supplies the second voltage and controlled to be turned off before the first gate control section supplies the first voltage; a first current addition line; a discharge line; a first resistor connected to the first current addition line; and a voltage source configured to supply the second voltage to the first gate control sections.

5 Claims, 15 Drawing Sheets

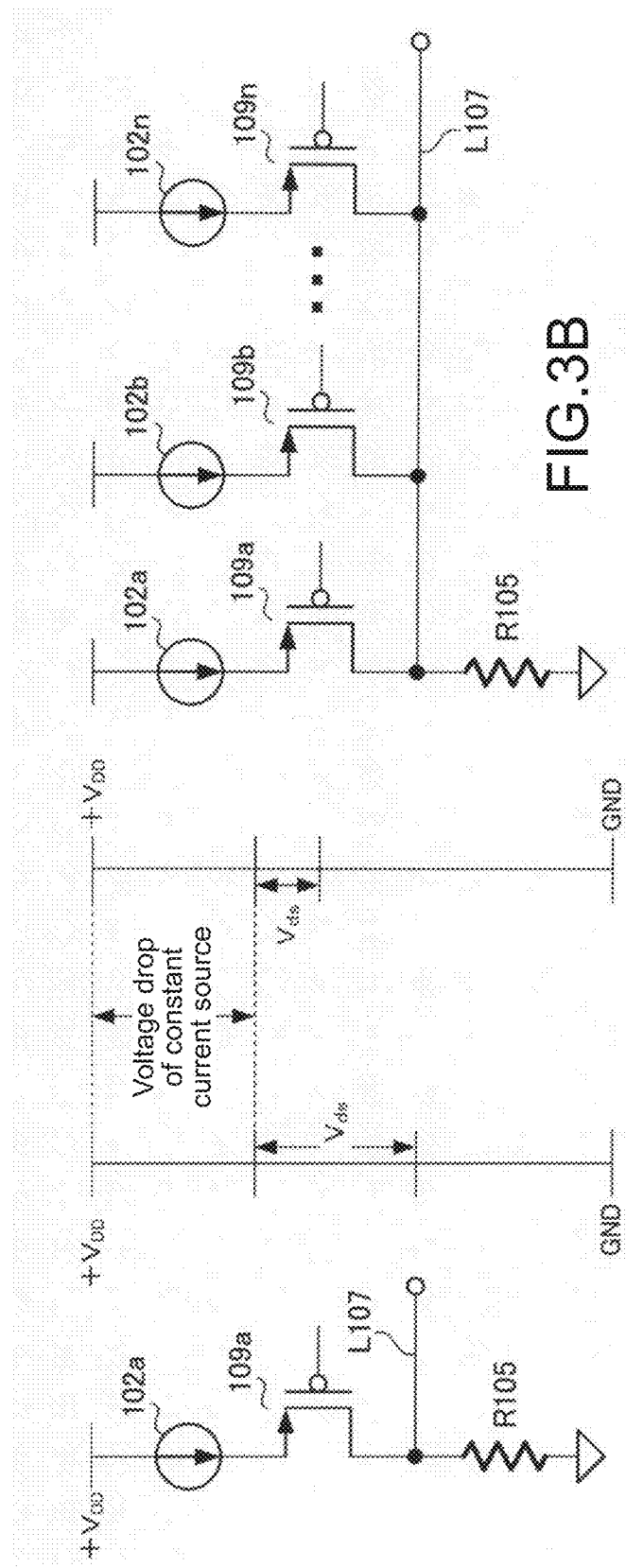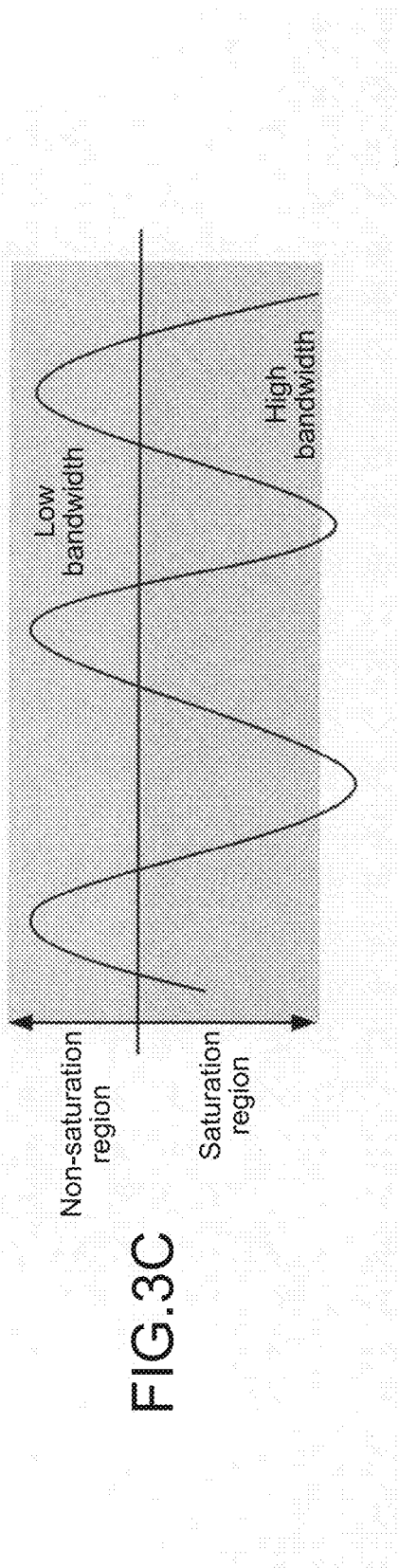
FIG.3A  FIG.3B  FIG.3C

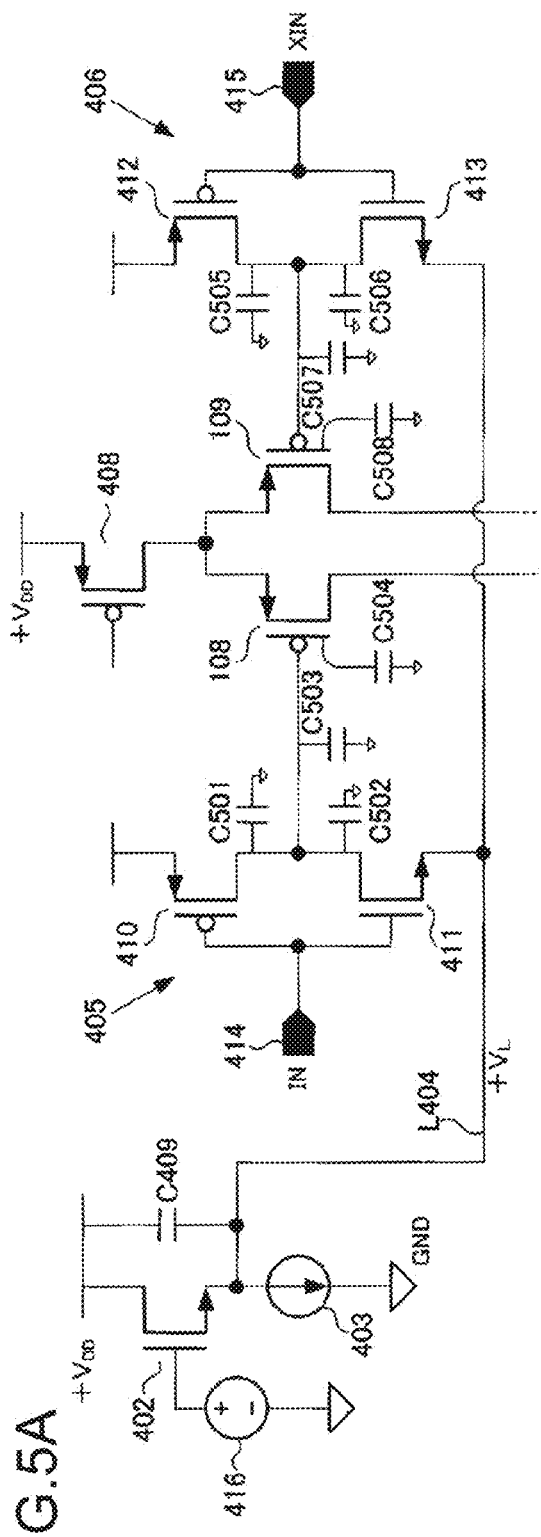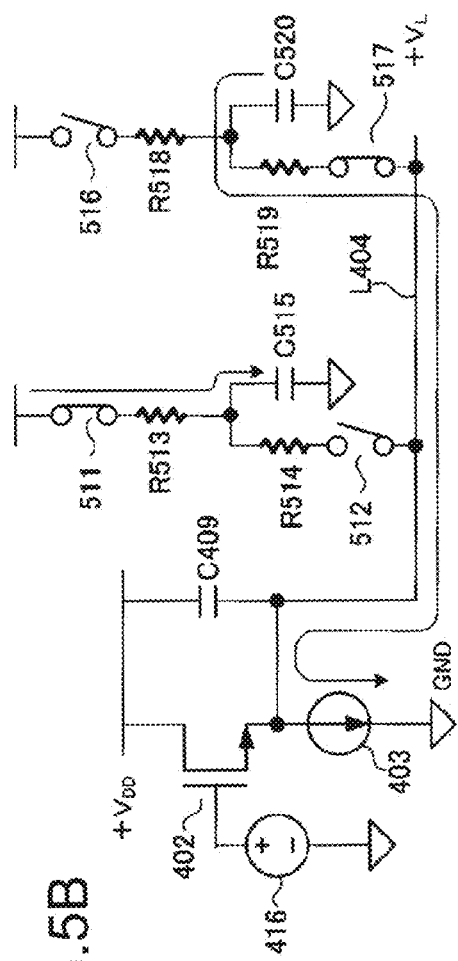
FIG.5A
FIG.5B

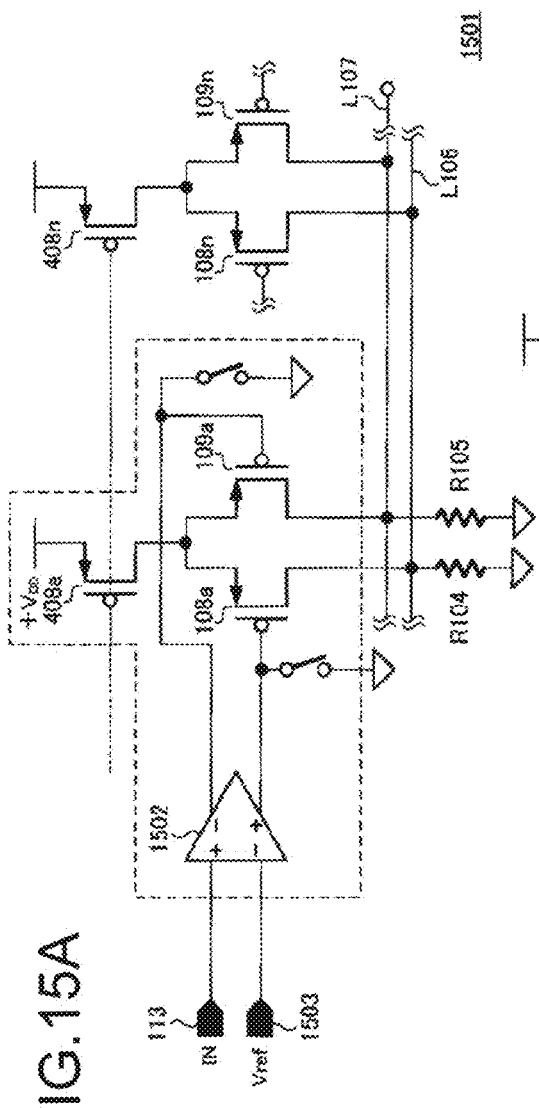
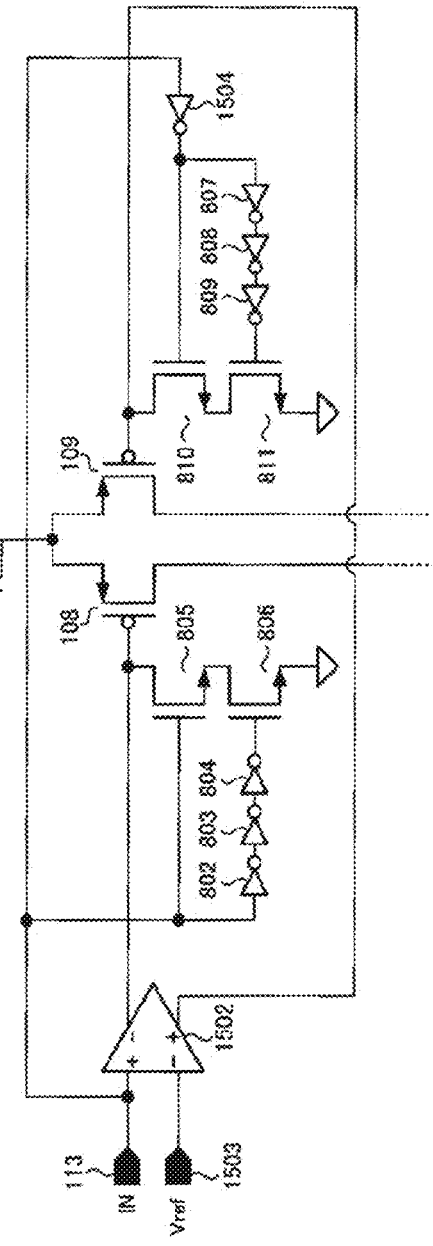
FIG.15A
FIG.15B

DIGITAL TO-ANALOG CONVERSION CIRCUIT

CROSS REFERENCE TO RELATED APPLICATIONS

This application claims the benefit of priority under 35 U.S.C. §119 from Japanese Priority Patent Application JP 2012-226748 filed on Oct. 12, 2012, the entire contents of each which is incorporated herein by reference.

BACKGROUND

The present disclosure relates to a current addition type digital-to-analog conversion circuit.

In recent years, inexpensive complementary metal-oxide semiconductors (CMOS) are used to manufacture system-on-chips (SOC) including analog circuits and digital circuits. Of those, current addition type digital-to-analog conversion circuits capable of operating at high speed are widely used for videos and communications.

On the other hand, customers have a strong demand for SOCs of higher-performance, more multifunctionality, miniaturization, lower power consumption, and the like. In particular, the lower power consumption is a factor that deteriorates the performance of digital-to-analog conversion circuits (hereinafter, referred to as D/A conversion circuit).

Japanese Patent Application Laid-open No. 2010-263660 discloses a technique considered to be similar to the present disclosure. Japanese Patent Application Laid-open No. 2010-263660 discloses a technique of, in a current switch circuit used in a current addition type D/A conversion circuit, improving the reduction in dynamic range, which is a problem when a transistor having a low threshold voltage is used at a low power-supply voltage, to obtain a large output voltage range.

SUMMARY

The use of the technique disclosed in Japanese Patent Application Laid-open No. 2010-263660 allows achievement of a D/A conversion circuit with which a wide dynamic range is obtained. However, it is revealed that glitch noise for which an output voltage suddenly drops as will be described later is generated in the technique disclosed in Japanese Patent Application Laid-open No. 2010-263660. The glitch noise deteriorates a spurious-free dynamic range (SFDR; a feasible dynamic range in which spurious noise does not interfere with basic waveforms and the basic waveforms are not distorted, and which is capable of ensuring linearity).

In view of the circumstances as described above, it is desirable to provide a D/A conversion circuit that consumes less power but achieves wide SFDR characteristics.

According to an embodiment of the present disclosure, there is provided a digital-to-analog conversion circuit including a plurality of current generation circuits.

The plurality of current generation circuits each include a constant current source configured to generate a current corresponding to a predetermined parameter, a first metal-oxide semiconductor field-effect transistor (MOSFET) that is connected to the constant current source and is configured to control a supply destination of the current, a first gate control section configured to exclusively supply a first voltage and a second voltage to a gate of the first MOSFET to control the first MOSFET, the first MOSFET being controlled to be turned off by the first voltage and turned on by the second voltage, and a first discharge switch that is connected to the first gate control section and the gate of the first MOSFET, is controlled to be turned on at the same time as the first gate control section supplies the second voltage to discharge charge accumulated in a parasitic capacitance to a predetermined target, the parasitic capacitance being in the first gate control section and the gate of the first MOSFET, and is controlled to be turned off before the first gate control section supplies the first voltage.

The digital-to-analog conversion circuit further includes: a first current addition line, to which the first MOSFETs are connected in parallel; a discharge line configured to discharge the charge; a first resistor connected to the first current addition line at a predetermined potential; and a voltage source configured to supply the second voltage to the first gate control sections.

According to the present disclosure, it is possible to provide a D/A conversion circuit that consumes less power but achieves wide SFDR characteristics.

The objects, configurations, effects other than those described above are clearly described in the following embodiments.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 3A, 3B, and 3C are diagrams for describing a problem of the D/A conversion circuit;

FIGS. 5A and 5B are a circuit diagram for describing a problem of a technique as the premise of the present disclosure, and an equivalent circuit diagram;

FIGS. 15A and 15B are circuit diagrams of a D/A conversion circuit according to a fifth embodiment of the present disclosure.

DETAILED DESCRIPTION OF EMBODIMENTS

Hereinafter, description will be given on embodiments of the present disclosure in the following composition.
  (Technique as Premise of Present Disclosure)
  (Basic Concept of Embodiment)
  (First Embodiment)
  (Modified Example of Basic Concept of Embodiment)
  (Second Embodiment)
  (Variations of Constant Voltage Source)
  (Third Embodiment)
  (Fourth Embodiment)
  (Fifth Embodiment)
  (Technique as Premise of Present Disclosure)

Figure 1A:
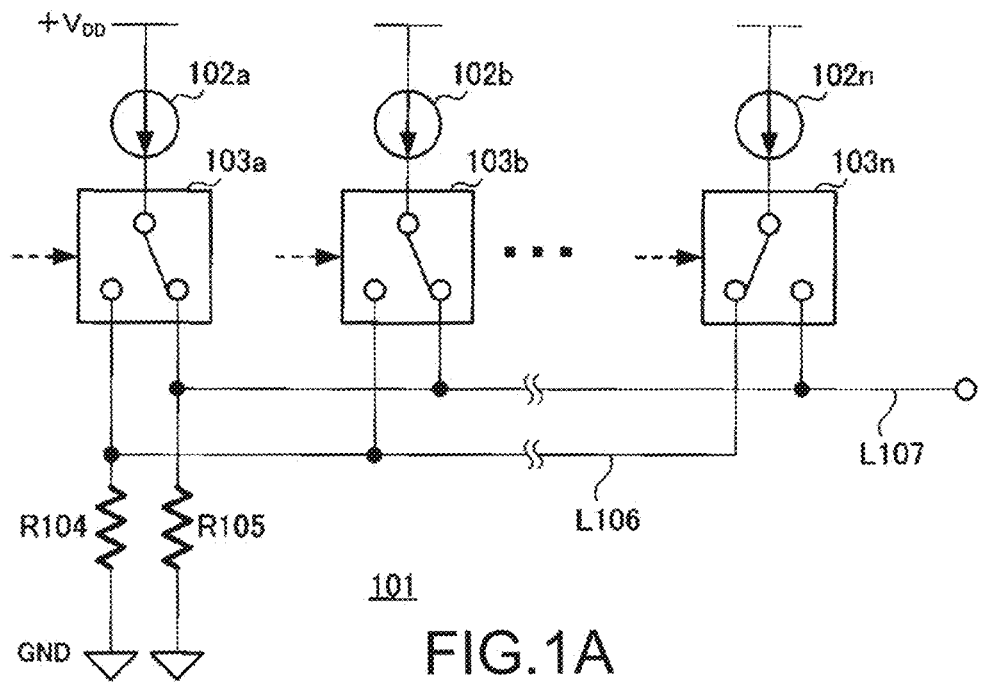
FIGS. 1A and 1B are a basic conceptual diagram of a current addition type digital-to-analog (D/A) conversion circuit and a circuit diagram corresponding to one parameter.
Figure 1B:
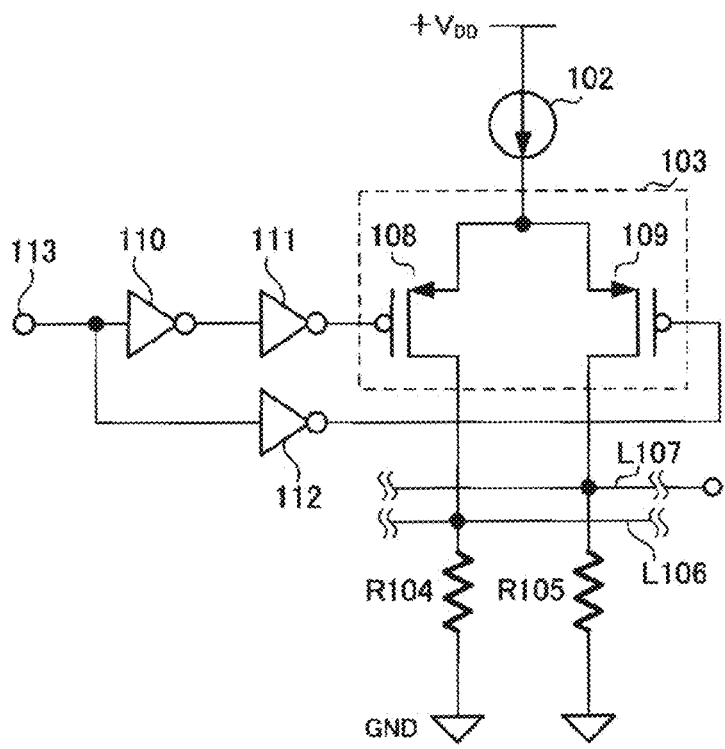

FIGS. 1A and 1B are a basic conceptual diagram of a current addition type digital-to-analog conversion circuit (hereinafter, referred to as D/A conversion circuit) as the premise of the present disclosure and a circuit diagram corresponding to one parameter.

FIG. 1A is the basic conceptual diagram of the current addition type D/A conversion circuit.

A D/A conversion circuit 101 includes constant current sources 102a, 102b, . . . , and 102n (hereinafter, referred to as "constant current source 102" unless otherwise designated) for individual predetermined parameters. Selector switches 103a, 103b, . . . , and 103n (hereinafter, referred to as "selector switch 103" unless otherwise designated) that are controlled in accordance with input digital signals (not shown) are connected to the constant current sources 102a, 102b, . . . , and 102n. The selector switches 103a, 103b, . . . , and 103n are controlled by binary code signals forming part of the input digital signals.

The selector switches 103a, 103b, . . . , and 103n are connected at one ends thereof to one end of a resistor R104 via a first current addition line L106.

The selector switches 103a, 103b, . . . , and 103n are connected at the other ends thereof to one end of a resistor R105 via a second current addition line L107.

The other ends of the resistors R104 and R105 are grounded. Further, the resistors R104 and R105 have the same resistance value.

The second current addition line L107 is drawn as an output terminal of the D/A conversion circuit 101. Therefore, when all the selector switches 103, that is, the selector switches 103a, 103b, . . . , and 103n, are connected to the second current addition line L107, a voltage at a maximum amplitude is output as an output signal of the D/A conversion circuit 101 between the second current addition line L107 and a ground potential (hereinafter, referred to as "GND"). Further, the D/A conversion circuit 101 is also applicable as a differential output D/A conversion circuit by combining the first current addition line L106 and the second current addition line L107. In particular, in the case where high-frequency signals such as television signals are handled, it is desirable for a D/A conversion circuit to have a differential output configuration because of use of a fully-differential amplifier.

A set of the constant current source 102 and the selector switch 103 is provided for each of necessary parameters in consideration of a circuit size. For example, in the case of a D/A conversion circuit 101 with 8-bit resolution, the constant current sources 102 corresponding to respective bit values are provided for the low-order four bits of "1, 2, 4, 8". Specifically, the low-order four bits are constituted of binary codes.

Then, 15 pieces of the constant current sources 102 corresponding to the value of "16" are provided for the high-order four bits. Specifically, the high-order four bits are constituted of thermometer codes.

FIG. 1B is a circuit diagram obtained when such a selector switch 103 is rewritten as a specific circuit.

Two P-channel metal-oxide semiconductor field-effect transistors (MOSFET) (hereinafter, referred to as "PMOSFET"; in the case of N-channel MOSFET, referred to as "NMOSFET") 108 and 109 enter on-state when a gate potential is below a source potential, that is, in a low potential.

Two NOT gates 110 and 111 are connected in series to a gate of the PMOSFET 108. On the other hand, one NOT gate 112 is connected to a gate of the PMOSFET 109. Therefore, for code signals that are input to a code input terminal 113 connected to the NOT gates 110 and 112, the PMOSFET 108 and the PMOSFET 109 always operate by an opposite logic.

Figure 2B:
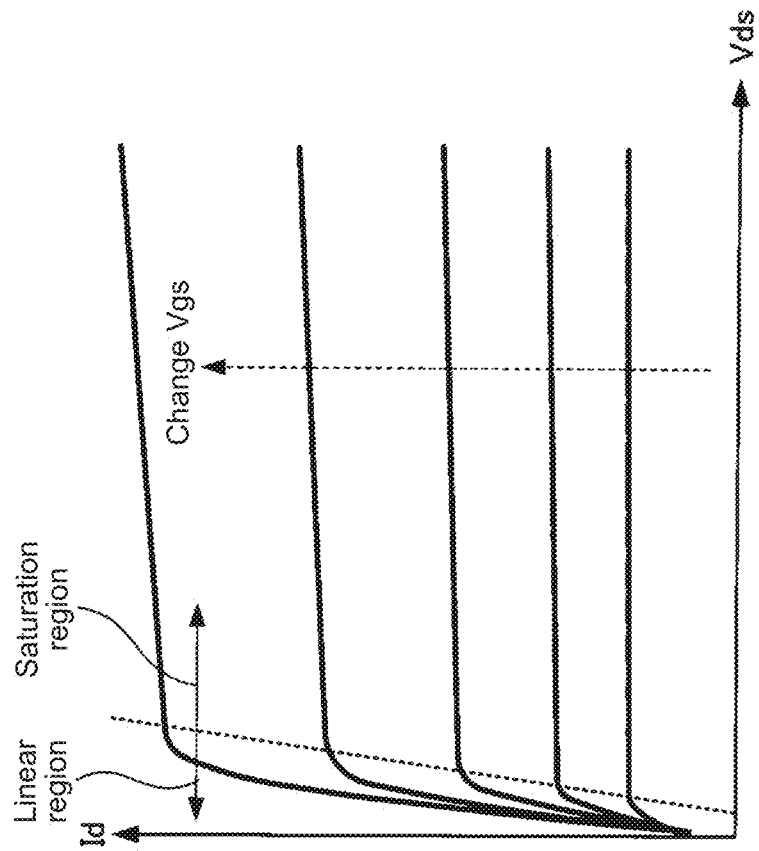
FIGS. 2A and 2B are diagrams for describing a relationship between a drain-source voltage and a drain current of a MOSFET.
Figure 2A:
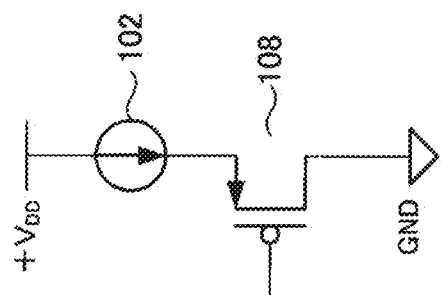

FIGS. 2A and 2B are diagrams for describing a relationship between a drain-source voltage and a drain current of the MOSFET.

FIG. 2A is a circuit diagram in which the constant current source 102 and the PMOSFET 108 are connected in series and a drain is grounded. As shown in FIG. 2A, in a state where the constant current source 102 and the PMOSFET 108 are connected in series to a power-supply voltage +$V_{DD}$, a relationship between a drain-source voltage Vds and a drain current Id is as shown in a graph of FIG. 2B.

As is well known, the operation of the MOSFET is divided into a non-saturation region (or linear region) and a saturation region in accordance with the level of Vds.

The non-saturation region is a state where Vds<Vgs-Vth (Vgs represents a gate-source voltage, and Vth represents a threshold voltage or on-voltage) and Vds and Id have a substantially proportional relationship.

The saturation region is a state where Vds>Vgs-Vth and corresponds to a constant-current operation in which Id hardly increases even if Vds increases.

In the saturation region, the following expression is established for the circuit of FIG. 2A.

$$Id \approx \frac{1}{2} \cdot \frac{W}{L} \mu Cox \cdot (Vgs - Vth)^2$$

where W represents a channel width, L represents a channel length, μ represents a carrier mobility, and Cox represents a capacity value per unit area of a gate oxide film.

In other words, in the saturation region, the drain-source voltage (Vds) of the MOSFET is uniquely determined by the gate-source voltage Vgs.

FIGS. 3A, 3B, and 3C are diagrams for describing a problem of the D/A conversion circuit 101.

FIG. 3A is a diagram for describing a circuit diagram corresponding to one parameter in the D/A conversion circuit 101 that is the same as FIG. 1B, and a potential of each point.

A source potential of a PMOSFET 109a is fixed by the constant current source 102a.

FIG. 3B is a diagram for describing a circuit diagram corresponding to a plurality of parameters in the D/A conversion circuit 101 and a potential of each point.

When a large number of circuits that each correspond to one parameter shown in FIG. 3A enter on-state, a large current corresponding to the circuits flows in the resistor R105 via the second current addition line L107. Then, a voltage between both ends of the resistor R105 increases. On the other hand, source potentials of the PMOSFETs 109a, 109b, . . . , and 109n in the circuits corresponding to the respective parameters are fixed by the constant current sources 102a, 102b, . . . , and 102n. Then, Vds of the PMOSFETs 109a, 109b, . . . , and 109n in the circuits corresponding to the respective parameters are lowered. When Vds are lowered, there occurs a state where the operation of the PMOSFETs 109a, 109b, . . . , and 109n is changed from the saturation region to the non-saturation region. In other words, a phenomenon that the operation of the PMOSFETs 109a, 109b, . . . , and 109n is alternatively changed between the saturation region and the non-saturation region in accordance with input codes of the D/A conversion circuit. Therefore, as shown in FIG. 3C, a difference in frequency band between the high-order bits and the low-order bits is generated and the waveform is distorted. This distortion becomes prominent as the dynamic range of the output of the D/A conversion circuit becomes wider. The fact that the waveform is distorted means that a spurious-free dynamic range (SFDR) is deteriorated. Such a phenomenon becomes prominent as a drive voltage $+V_{DD}$ of the PMOSFETs 109a, 109b, . . . , and 109n that form the selector switches 103 becomes lower.

Figure 4A:
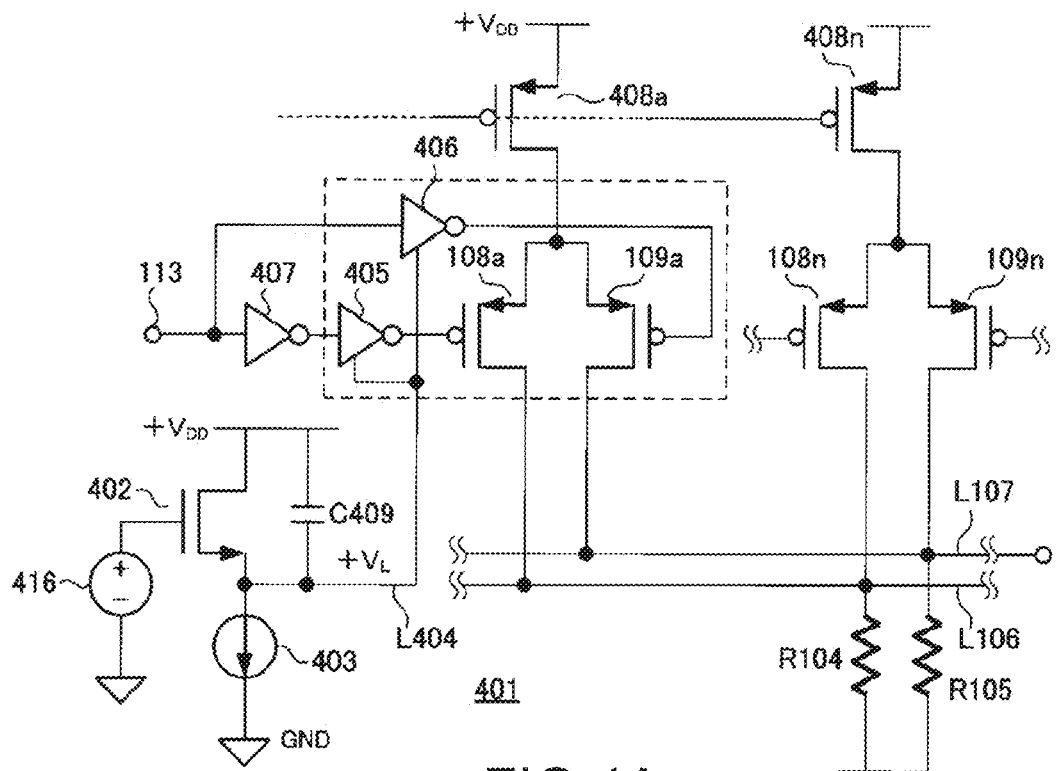
FIGS. 4A and 4B are circuit diagrams of an improved D/A conversion circuit.
Figure 4B:
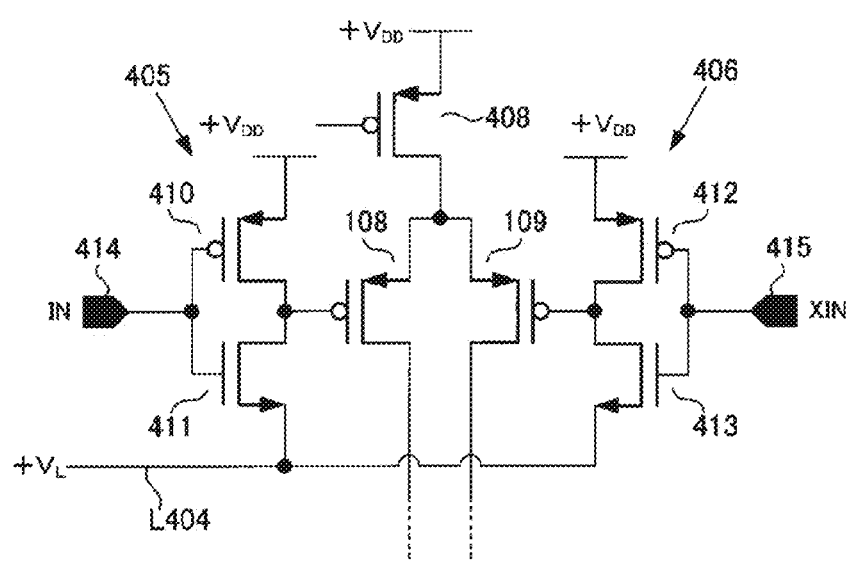

FIGS. 4A and 4B are circuit diagrams of an improved D/A conversion circuit 401.

The cause of the deteriorated SFDR results from a lower Vds. In order to ensure a margin of Vds, Vds when the MOSFET is in on-state is increased. In order to increase Vds, when the PMOSFETs 108 and 109 enter on-state, a gate voltage is not set to a ground potential (GND) but increased to a predetermined potential higher than GND and lower than the power-supply voltage $+V_{DD}$, at which the PMOSFETs 108 and 109 can enter on-state. In other words, gate potentials of the PMOSFETs 108 and 109 are turned on and off at the power-supply voltage $+V_{DD}$ and the predetermined potential higher than GND and lower than $+V_{DD}$. For that reason, the NOT gates 111 and 112 connected to the gates of the PMOSFETs 108 and 109 are configured to output the power-supply voltage and the predetermined voltage higher than GND.

It should be noted that hereinafter the "predetermined voltage" is referred to as a switching voltage. The switching voltage refers to a voltage that is applied to the gates of the PMOSFETs 108 and 109 forming the selector switch to turn on the PMOSFETs 108 and 109.

FIG. 4A is a circuit diagram of the improved D/A conversion circuit 401.

A drain of an NMOSFET 402 forming a source follower is connected to the power-supply voltage $+V_{DD}$, and a source thereof is connected to a constant current source 403. The other end of the constant current source 403 is grounded. A constant voltage source 416 is connected to a gage of the NMOSFET 402. A gate voltage of the NMOSFET 402 is controlled to have a constant voltage by the constant voltage source 416, and the NMOSFET 402 and the constant current source 403 generate a switching voltage $+V_L$. The switching voltage $+V_L$ is supplied to NOT gates 405 and 406 via a switching voltage line L404. A capacitor C409 is connected between the switching voltage line L404 and the power-supply voltage $+V_{DD}$ in order to stabilize the switching voltage $+V_L$.

Code signals to be input to the code input terminal 113 are input to the NOT gates 406 and 407.

The code signal whose logic is inverted by the NOT gate 406 controls the PMOSFET 109a.

Additionally, the NOT gate 405 inverts again the logic of the code signal, which has been inverted by the NOT gate 407. The code signal whose logic is restored to the original one by the NOT gate 405 controls the PMOSFET 108a.

Instead of GND, the switching voltage $+V_L$ is applied to the NOT gates 405 and 406 of the PMOSFETs 108a and 109a forming the selector switch 103. As a result, for the PMOSFETs 108a and 109a, $+V_{DD}$ and $+V_L$ are switched.

It should be noted that the PMOSFETs 408a to 408n are the constant current sources 102. Those PMOSFETs 408a to 408n share a gate voltage and thus each FET outputs an equal drain current.

FIG. 4B is a circuit diagram corresponding to one parameter shown in a dashed-line frame of the circuit diagram of FIG. 4A.

The NOT gate 405 to which an inverting input code terminal 414 is connected is formed of a PMOSFET 410 and an NMOSFET 411.

The NOT gate 406 to which a non-inverting input code terminal 415 is connected is formed of a PMOSFET 412 and an NMOSFET 413.

The switching voltage $+V_L$ is applied to sources of the NMOSFETs 411 and 413 via the switching voltage line L404. Therefore, the NOT gates 405 and 406 output any of $+V_{DD}$ and $+V_L$.

FIG. 5A is a circuit diagram in which parasitic capacitances are illustrated based on the circuit diagrams of FIGS. 4A and 4B.

When a code signal whose logic to be input to the inverting input code terminal 414 is inverted is at a low potential, the PMOSFET 410 of the NOT gate 405 enters on-state. When the PMOSFET 410 of the NOT gate 405 enters on-state, the power-supply voltage $+V_{DD}$ is applied to a gate of the PMOSFET 108 forming the selector switch 103. As is well known, the MOSFET itself incorporates a parasitic capacitance. Further, the wiring of a large-scale integration (LSI) also incorporates a parasitic capacitance.

A parasitic capacitance C501 exists in a drain of the PMOSFET 410.

A parasitic capacitance C502 exists in a drain of the NMOSFET 411.

A parasitic capacitance C503 exists in wiring between the drains of the PMOSFET 410 and NMOSFET 411 and the gate of the PMOSFET 108.

A parasitic capacitance C504 exists in the gate of the PMOSFET 108.

Therefore, when the PMOSFET 410 enters on-state, charge is accumulated in the parasitic capacitance C501 that exists in the drain of the PMOSFET 410, the parasitic capacitance C502 that exists in the drain of the NMOSFET 411, the parasitic capacitance C503 that exists in the wiring between the drains and the gate, and the parasitic capacitance C504 that exists in the gate of the PMOSFET 108 from the power-supply voltage $+V_{DD}$.

Similarly, when a code signal to be input to the non-inverting input code terminal 415 is at a low potential, the PMOSFET 412 of the NOT gate 406 enters on-state. When the PMOSFET 412 of the NOT gate 406 enters on-state, the power-supply voltage $+V_{DD}$ is applied to the gate of the PMOSFET 109 forming the selector switch 103.

A parasitic capacitance C505 exists in a drain of the PMOSFET 412.

A parasitic capacitance C506 exists in a drain of the NMOSFET 413.

A parasitic capacitance C507 exists in wiring between the drains of the PMOSFET 412 and NMOSFET 413 and the gate of the PMOSFET 109.

A parasitic capacitance C508 exists in the gate of the PMOSFET 109.

Therefore, when the PMOSFET 412 enters on-state, charge is accumulated in the parasitic capacitance C505 that exists in the drain of the PMOSFET 412, the parasitic capacitance C506 that exists in the drain of the NMOSFET 413, the parasitic capacitance C507 that exists in the wiring between the drains and the gate, and the parasitic capacitance C508 that exists in the gate of the PMOSFET 109 from the power-supply voltage +$V_{DD}$.

FIG. 5B is an equivalent circuit diagram in which attention is focused on only the parasitic capacitances of the circuit diagram shown in FIG. 5A.

MOSFETs can be equivalently represented by switches, resistors, and capacitors. Therefore, the PMOSFET 410 and the NMOSFET 411 that form the NOT gate 405 can be represented by switches 511 and 512, resistors R513 and R514, and a capacitor C515. Similarly, the PMOSFET 412 and the NMOSFET 413 that form the NOT gate 406 can be represented by switches 516 and 517, resistors R518 and R519, and a capacitor C520.

Of those, the capacitor C515 is a combined parasitic capacitance obtained by combining the parasitic capacitances C501, C502, C503, and C504 that exist in the NOT gate 405 and the PMOSFET 108 of the selector switch 103. Similarly, the capacitor C520 is a combined parasitic capacitance obtained by combining the parasitic capacitances C505, C506, C507, and C508 that exist in the NOT gate 406 and the PMOSFET 109 of the selector switch 103.

Figure 6:
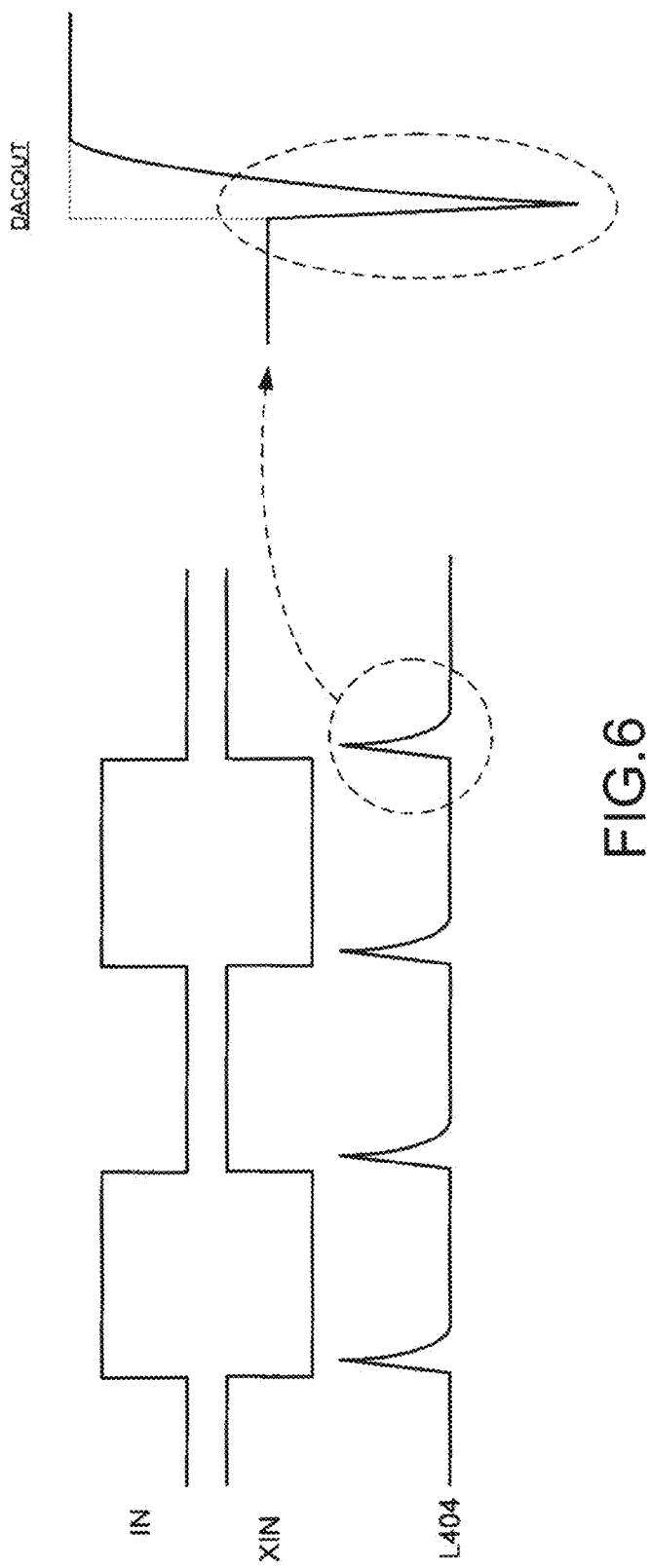
FIG. 6 is a diagram showing signal waveforms of a D/A conversion circuit of the technique as the premise of the present disclosure.

FIG. 6 is a diagram showing signal waveforms of the D/A conversion circuit 401 of the technique as the premise of the present disclosure.

As shown in FIG. 5B, when a code signal is input to the NOT gates 405 and 406, the charge accumulated in the capacitors C515 and C520 as the combined parasitic capacitances flows into the constant current source 102 via the switching voltage line L404. However, the constant current source 102 has an impedance that may be called a variable resistor that achieves a constant current. Therefore, it takes a little bit of time to completely discharge the charge accumulated in the capacitors C515 and C520 as the combined parasitic capacitances. This operation occurs in the circuits corresponding to all the parameters, which form the D/A conversion circuit 401. Then, the potential of the switching voltage line L404 instantly rises to a potential equal to the power-supply voltage +$V_{DD}$ or a potential close thereto.

The potential of the switching voltage line L404 rises to the power-supply voltage +$V_{DD}$, which means that the PMOSFETs 108 and 109 of the selector switch 103 to be turned on are not turned on. Therefore, as shown in FIG. 6, glitch noise in which an output voltage instantly sharply drops at a moment of a code signal switching is generated in the second current addition line L107.

It should be noted that the glitch noise has a polarity that changes according to a circuit configuration. In the case where the selector switch is formed of NMOSFETs, an output voltage instantly sharply rises contrary to the case of the PMOSFETs.

Reduction of the glitch noise can be achieved by reducing an impedance of a circuit that supplies the switching voltage. Some methods are conceived for the reduction in impedance.

One of the methods is a method of increasing a current amount of the constant current source 403. In this case, power consumption of the LSI forming the D/A conversion circuit 401 is increased.

The other method is a method of increasing a capacity of the capacitor C409 that is connected to the NMOSFET 402 in parallel. In this case, a mounting area of the LSI forming the D/A conversion circuit 401 is increased.

In other words, the approach to reduce the impedance of the circuit that supplies the switching voltage goes against the recent miniaturization and lower power consumption of LSIs and is undesirable.

(Basic Concept of Embodiment)

The inventors of the present disclosure focused attention on the fact that the above-mentioned glitch noise is caused by the charge accumulated in the parasitic capacitances that exist in the MOSFETs and the wiring thereof. In order to reduce the glitch noise, no charge is caused to flow in the switching voltage line L404. Specifically, charge only needs to be discharged through a path different from the switching voltage line L404.

Figures 7A, 7B:
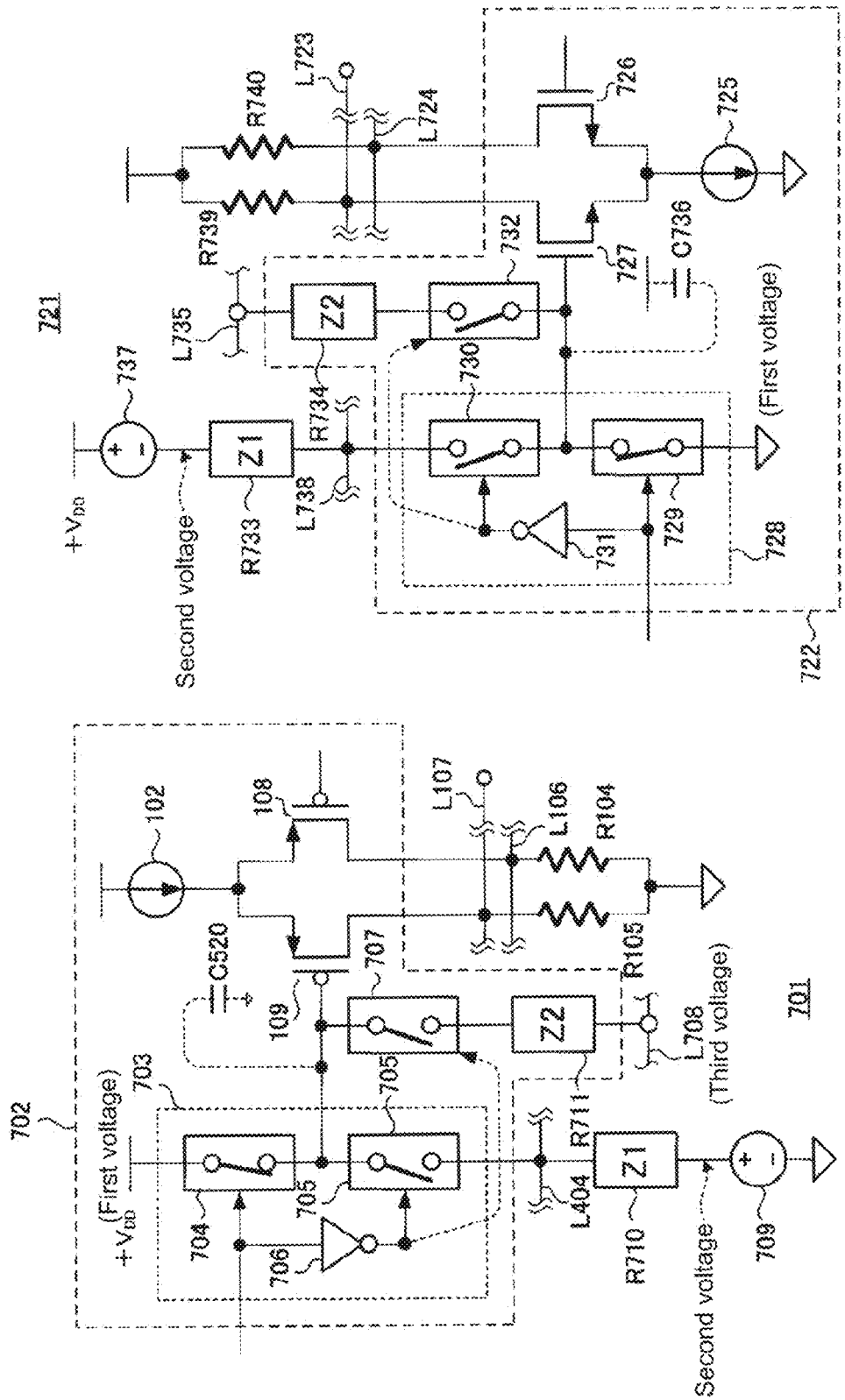
FIGS. 7A and 7B are diagrams each showing a basic concept of an embodiment.

FIGS. 7A and 7B are diagrams each showing a basic concept of an embodiment.

First, a basic concept of this embodiment will be described with reference to FIG. 7A.

A D/A conversion circuit 701 of this embodiment is formed by connecting a plurality of current generation circuits 702, each of which generates a current corresponding to a predetermined parameter, to the first current addition line L106 and the second current addition line L107. Each of the current generation circuits 702 supplies a current corresponding to a predetermined parameter to any one of the first current addition line L106 and the second current addition line L107 in accordance with a code signal input from the outside.

The constant current source 102 generates a current corresponding to a predetermined parameter.

The PMOSFET 108 and the PMOSFET 109 are exclusively subjected to switching control to exclusively supply the current of the constant current source 102 to any one of the first current addition line L106 and the second current addition line L107.

A gate control section 703 exclusively applies a first voltage and a second voltage to the gate of the PMOSFET 109.

The first voltage is a voltage for turning off the PMOSFETs 108 and 109. For example, the first voltage is the power-supply voltage +$V_{DD}$, but it is not necessarily limited thereto.

The second voltage is a voltage for turning on the PMOSFETs 108 and 109. For example, the second voltage is +$V_L$ that is higher than GND and lower than the power-supply voltage +$V_{DD}$.

As an example of the inside of the gate control section 703, a first switch 704 that outputs the first voltage and a second switch 705 that outputs the second voltage are exclusively turned on and off by the NOT gate 706 so that the first voltage and the second voltage are exclusively applied to the gate of the PMOSFET 109.

The first switch 704 and the second switch 705 are exclusively turned on and off so that any of the first voltage and the second voltage is applied to the gate of the PMOSFET 109 forming the selector switch. When the first voltage is applied to the gate of the PMOSFET 109, the PMOSFET 109 is controlled to be turned off, and when the second voltage is applied to the gate of the PMOSFET 109, the PMOSFET 109 is controlled to be turned on.

In addition thereto, a third switch 707 also called a discharge switch, which is connected to the gate of the PMOSFET 109, is connected to a discharge line L708 that supplies a third voltage via a second impedance R711.

The third voltage is a voltage that is lower than the first voltage and is for discharging the capacitor C520 that serves as the combined parasitic capacitance and exists on a line connected to the gate of the PMOSFET 109. For example, the third voltage is GND, but it is not necessarily limited thereto.

The second voltage is generated from a constant voltage source 709, a first impedance R710 is caused, and the second voltage is supplied to the plurality of current generation circuits 702 via the switching voltage line L404.

On the other hand, the second impedance R711 exists between the discharge line L708 and the third switch 707. The second impedance R711 is an impedance that incorporates output impedances and the like of the third switch 707, a wiring resistor, and a buffer and is smaller than the first impedance R710.

It should be noted that though not illustrated in FIG. 7A because of space limitations, a gate control section that is the same as the gate control section 703 and a third switch that is the same as the third switch 707 are connected to the gate of the PMOSFET 108 as in the PMOSFET 109.

The third switch 707 is turned on at the same time as the second switch 705 is turned on, and then immediately turned off. Then, the charge accumulated in the capacitor C520 as the parasitic capacitance is discharged to the discharge line L708 via the third switch 707. In other words, the third switch 707 is turned on and off only for the purpose of discharging the charge accumulated in the capacitor C520 as the parasitic capacitance.

The addition of the third switch 707 allows the charge accumulated in the capacitor C520 as the parasitic capacitance to be discharged instantly to the discharge line L708 via the third switch 707. Therefore, the phenomenon that a voltage of the switching voltage line L404 rises to a voltage close to the first voltage can be prevented from occurring, and thus the generation of the glitch noise can be prevented.

It should be noted that the discharge line L708 is a supply terminal in reality. Specifically, the discharge line L708 is a terminal that supplies a power-supply voltage or GND. The third switch 707 discharges the charge accumulated in the capacitor C520 toward the discharge line L708 to which the third switch 707 is directly or indirectly connected. At that time, there is a possibility that a factor that varies a voltage exists between the third switch 707 and the supply terminal. For that reason, a component to be connected to the third switch 707 is not necessarily limited to be equal to the power-supply voltage or the ground potential. Since the second impedance R711 located between the third switch 707 and the discharge line L708 is smaller than the first impedance R710, the charge accumulated in the capacitor C520 can be discharged quickly.

The same holds true for a discharge line L735 that will be described later with reference to FIG. 7B.

(First Embodiment)

Hereinafter, description will be given on an actual circuit example based on the basic concept of the present disclosure shown in FIG. 7A.

Figure 8A:
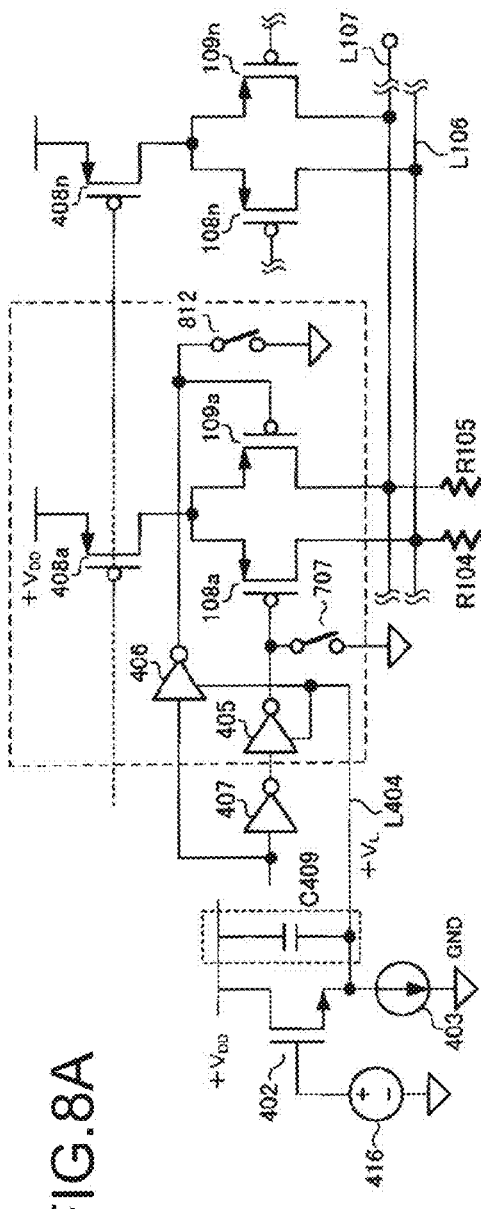
FIGS. 8A and 8B are circuit diagrams of a D/A conversion circuit according to a first embodiment of the present disclosure.
Figure 8B:
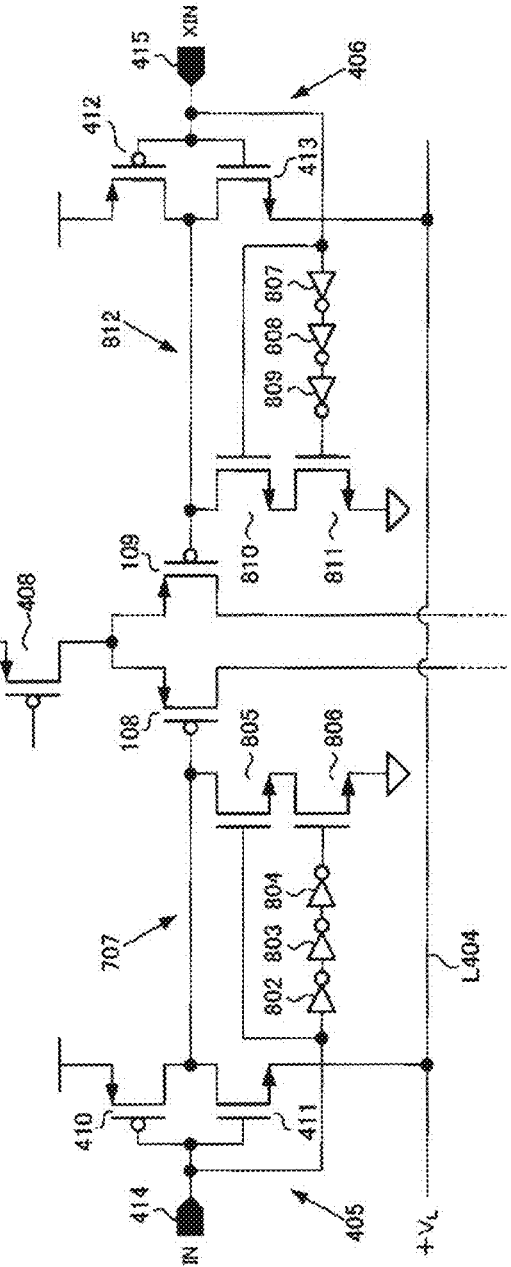

FIGS. 8A and 8B are circuit diagrams of a D/A conversion circuit 801 according to a first embodiment of the present disclosure.

FIG. 8A is a circuit diagram showing the entire configuration of the D/A conversion circuit 801. The circuit diagram shown in FIG. 8A is basically the same as that of FIG. 4A. FIG. 8A is different from the FIG. 4A in that the third switch 707 is connected to the gate of the PMOSFET 108a and a switch 812 is connected to a gate of the PMOSFET 109a.

FIG. 8B is a circuit diagram for specifically describing a circuit surrounded by a dashed-line frame of FIG. 8A. As compared to FIG. 4B, a first NOT gate 802, a second NOT gate 803, a third NOT gate 804, and two NMOSFETs 805 and 806 are additionally provided in FIG. 8B.

The NOT gate 405 to which the inverting input code terminal 414 is connected is a general complementary metal-oxide semiconductor (CMOS) inverter formed by a combination of the PMOSFET 410 and the NMOSFET 411.

However, a source of the NMOSFET 411 is connected not to GND but to the switching voltage line L404. Therefore, the NOT gate 405 outputs an output voltage of $+V_L$ when a high potential is applied to the gate from the inverting input code terminal 414 and outputs an output voltage of $+V_{DD}$ when a low potential is applied to the gate.

The output terminal (drains of the PMOSFET 410 and the NMOSFET 411) of the NOT gate 405 is connected to the gate of the PMOSFET 108 forming the selector switch 103.

A drain of the NMOSFET 805 is connected to the output terminal of the NOT gate 405. A drain of the NMOSFET 806 is connected to a source of the NMOSFET 805. A source of the NMOSFET 806 is grounded.

A gate of the NMOSFET 805 is connected to an input terminal of the NOT gate 405.

On the other hand, the first NOT gate 802, the second NOT gate 803, and the third NOT gate 804 are connected in series between the gate of the NMOSFET 806 and the inverting input code terminal 414. As is well known, the NOT gate also functions as a short-time delay circuit. Those two NMOSFETs 805 and 806, the first NOT gate 802, the second NOT gate 803, and the third NOT gate 804 form the third switch 707 shown in FIG. 7A.

Similarly, a circuit continuous to the NOT gate 406 connected to the non-inverting input code terminal 415 has a circuit configuration equivalent to the circuit continuous to the NOT gate 405 connected to the inverting input code terminal 414.

The NOT gate 406 is formed by a combination of the PMOSFET 412 and the NMOSFET 413.

The output terminal of the NOT gate 406 is connected to the gate of the PMOSFET 109 forming the selector switch 103.

A drain of the NMOSFET 810 is connected to the output terminal of the NOT gate 406. A drain of the NMOSFET 811 is connected to a source of the NMOSFET 810. A source of the NMOSFET 811 is grounded.

A gate of the NMOSFET 810 is connected to an input terminal of the NOT gate 405.

On the other hand, three NOT gates 807, 808, and 809 are connected in series between the gate of the NMOSFET 811 and the non-inverting input code terminal 415.

Those two NMOSFETs 810 and 811 and the NOT gates 807, 808, and 809 form the switch 812 of FIG. 8A.

Figure 9A:
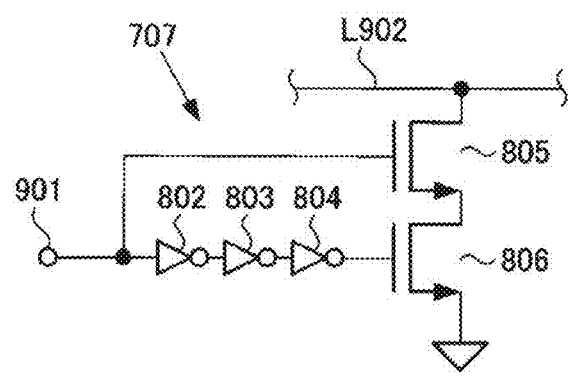
FIGS. 9A and 9B are a circuit diagram of a third switch according to the first embodiment and a timing chart of signals in respective sections.
Figure 9B:
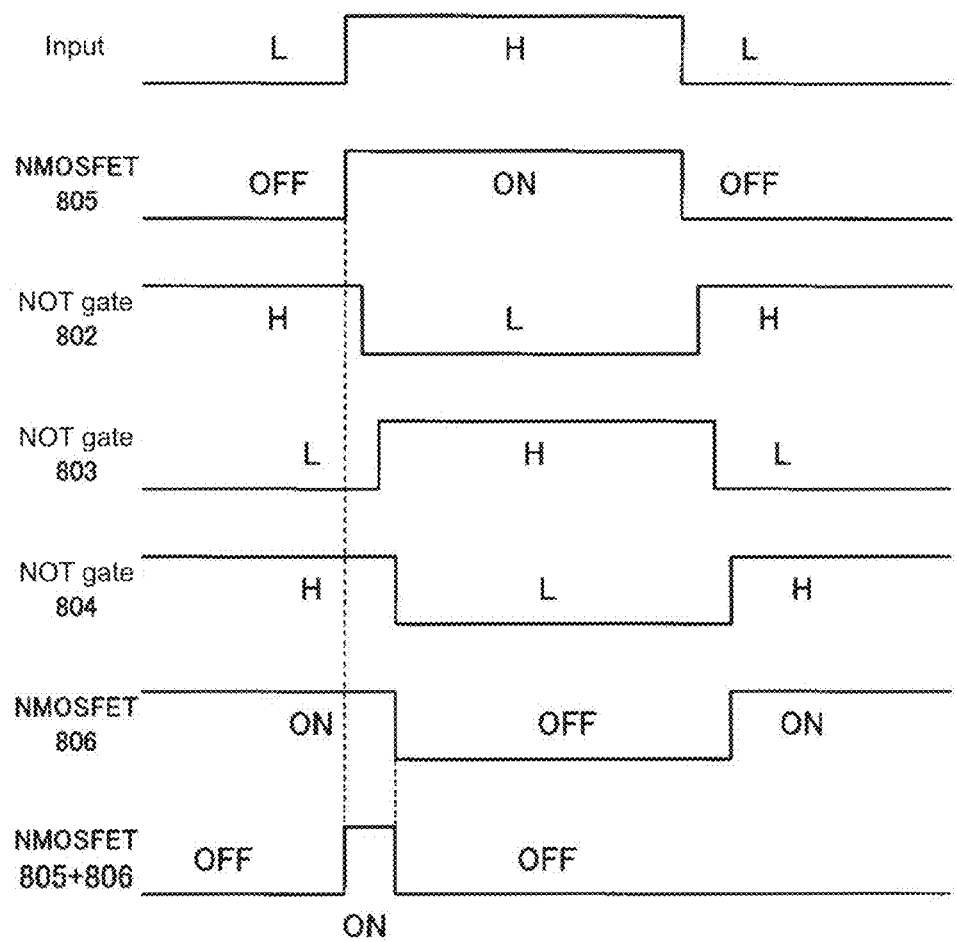

FIGS. 9A and 9B are a circuit diagram of the third switch 707 according to the first embodiment and a timing chart of signals in respective sections.

It is assumed that square wave logic signals with low potential ("L" in FIG. 9B) and with high potential ("H" in FIG. 9B) are input to an input terminal 901. Then, the NMOSFET 805 is turned off when the voltage of the input terminal 901 is L, and turned on when the voltage of the input terminal 901 is H.

On the other hand, the first NOT gate 802 outputs an opposite logic signal with a slight delay after the logic signal. Similarly, the second NOT gate 803 outputs an opposite logic signal with a slight delay after the output signal of the first NOT gate 802. Similarly, the third NOT gate 804 outputs an opposite logic signal with a slight delay after the output signal of the second NOT gate 803. Then, the NMOSFET 806 is turned off when the voltage of the input terminal is L, and turned on when the voltage of the input terminal is H.

Since the source of the NMOSFET 805 and the drain of the NMOSFET 806 are connected in series, when both of the NMOSFET 805 and the NMOSFET 806 are turned on, a control line L902 and GND are connected to each other. Then, charge accumulated in the capacitor C515 as the parasitic capacitance connected to the control line L902 is discharged to GND.

Figure 10:
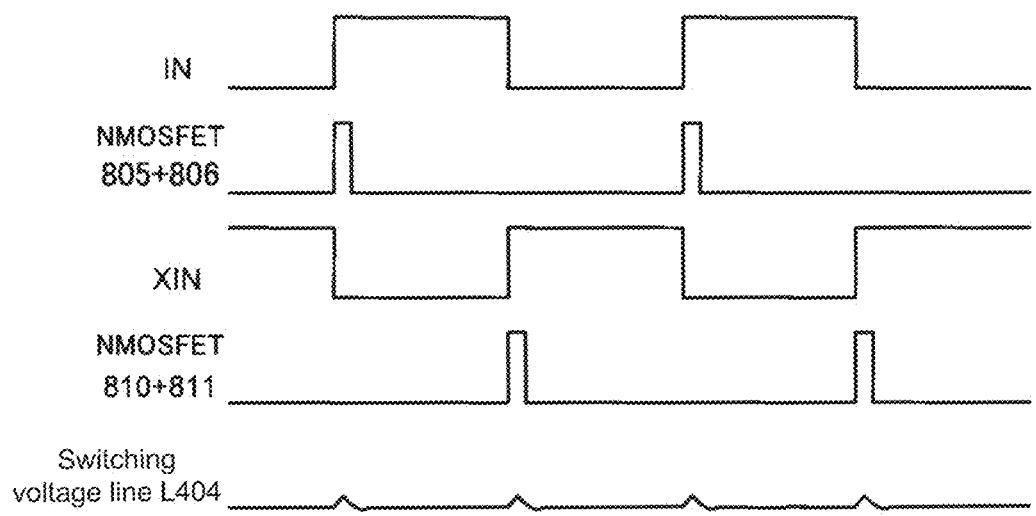
FIG. 10 is a timing chart of a code input signal, the third switch, and a switching voltage line.

FIG. 10 is a timing chart of a voltage in the code input signal, the third switch 707, and the switching voltage line L404.

In response to the rising of an input signal, the third switch 707 connects the control line L902 to GND in a short period of time to discharge the charge of the capacitor C515 as the parasitic capacitance. Therefore, the fluctuation of the switching voltage line L404 is suppressed to the minimum.

Time necessarily spent for discharge of the charge accumulated in the capacitor C520 as the parasitic capacitance is a design matter that depends on the capacity of the capacitor C520 as the parasitic capacitance and the impedance of the third switch 707, which may not be rigorously thought. The time may be sufficient if it is equal to or shorter than at least the half of a cycle (sampling frequency) of the code signal that controls the selector switch 103. Even if a connection time of the third switch 707 is too elongated and the potential of the gate line is lowered to GND, when the third switch 707 is released, the potential of the gate line is recovered instantly to a predetermined potential by the constant voltage source. Further, the PMOSFETs 108 and 109 forming the selector switch 103 are turned on when the gate potential is lowered at least to $+V_L$ before being lowered to GND. Thus, the glitch noise becomes inherently difficult to occur.

Hereinabove, the first embodiment based on the basic concept shown in FIG. 7A has been described.

By addition of the third switch 707, the D/A conversion circuit 801 of this embodiment can suppress the generation of the glitch noise. This fact does not involve an increase in power consumption and an increase in mounting area of an LSI, such as an increase in current of the constant current source 102, an increase in capacity of the capacitor C409 as a decoupling capacitor, and an increase in amplification factor of the NMOSFET 402 that have been used so far.

(Modified Example of Basic Concept of Embodiment)

FIG. 7A shows the basic concept of a form in which the output terminal of the D/A conversion circuit 801 adds currents in accordance with an input digital value. Specifically, FIG. 7A shows a circuit of a form in which a current "flows out" from the output terminal to an external circuit.

Conversely, a circuit in a form in which a current "flows in" from an external circuit to the output terminal can be configured.

A modified example of the basic concept of the embodiment will be described with reference to FIG. 7B.

A D/A conversion circuit 721 of this embodiment is formed by connecting a plurality of current generation circuits 722, each of which generates a current corresponding to a predetermined parameter, to a first current addition line L723 and a second current addition line L724. Each of the current generation circuits 722 supplies a current corresponding to a predetermined parameter to any one of the first current addition line L723 and the second current addition line L724 in accordance with a code signal input from the outside.

A constant current source 725 generates a current corresponding to a predetermined parameter.

An NMOSFET 726 and an NMOSFET 727 are exclusively subjected to switching control to exclusively supply the current of the constant current source 725 to any one of the first current addition line L723 and the second current addition line L724.

A gate control section 728 exclusively applies a first voltage and a second voltage to a gate of the gate of the NMOSFET 727.

The first voltage is a voltage for turning off the NMOSFETs 726 and 727. For example, the first voltage is GND, but it is not necessarily limited thereto.

The second voltage is a voltage for turning on the NMOSFETs 726 and 727. For example, the second voltage is $+V_H$ that is higher than GND and lower than the power-supply voltage $+V_{DD}$.

As an example of the inside of the gate control section 728, a first switch 729 that outputs the first voltage and a second switch 730 that outputs the second voltage are exclusively turned on and off by the NOT gate 731 so that the first voltage and the second voltage are exclusively applied to the gate of the NMOSFET 727.

The first switch 729 and the second switch 730 are exclusively turned on and off so that any of the first voltage and the second voltage is applied to the gate of the NMOSFET 727 forming the selector switch. When the first voltage is applied to the gate of the NMOSFET 727, the NMOSFET 727 is controlled to be turned off, and when the second voltage is applied to the gate of the NMOSFET 727, the NMOSFET 727 is controlled to be turned on.

In addition thereto, a third switch 732 connected to the gate of the NMOSFET 727 is connected to a discharge line L735 that supplies a third voltage via a second impedance R734.

The third voltage is a voltage that is higher than the first voltage and is for discharging the parasitic capacitance C736 (corresponding to C520) as the combined parasitic capacitance that exists on a line connected to the gate of the NMOSFET 727. For example, the third voltage is the power-supply voltage $+V_{DD}$, but it is not necessarily limited thereto.

The second voltage is generated from a constant voltage source 737, a first impedance R733 is caused, and the second voltage is supplied to the plurality of current generation circuits 722 via a switching voltage line L738.

On the other hand, the second impedance R734 exists between the discharge line L735 and the third switch 732. The second impedance R734 is an impedance incorporated in the third switch 732 and is smaller than the first impedance R733.

The third switch 732 is turned on at the same time as the second switch 730 is turned on, and then immediately turned off. Then, charge accumulated in the parasitic capacitance C736 is discharged to the discharge line L735 via the third switch 732. In other words, the third switch 732 is turned on and off only for the purpose of discharging the charge accumulated in the parasitic capacitance C736.

The addition of the third switch 732 allows the charge accumulated in the parasitic capacitance C736 to be discharged instantly to the discharge line L735. Therefore, the phenomenon that a voltage of the switching voltage line L738 drops to a voltage close to the first voltage can be prevented from occurring, and thus the generation of the glitch noise can be prevented.

In the case of FIG. 7A, positive charge is accumulated in the parasitic capacitance, and therefore the third switch 707 discharges the positive charge in a negative direction.

In the case of FIG. 7B, negative charge is accumulated in the parasitic capacitance, and therefore the third switch 732 discharges the negative charge in a positive direction.

(Second Embodiment)

A second embodiment will be described in light of the basic concept shown in FIG. 7B.

Figure 11A:
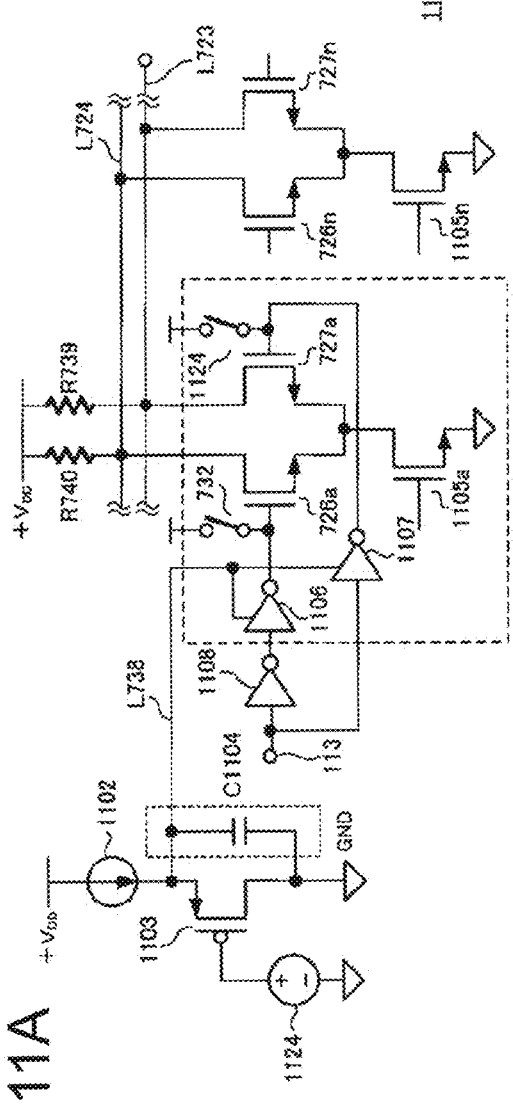
FIGS. 11A and 11B are circuit diagrams of a D/A conversion circuit according to a second embodiment of the present disclosure.
Figure 11B:
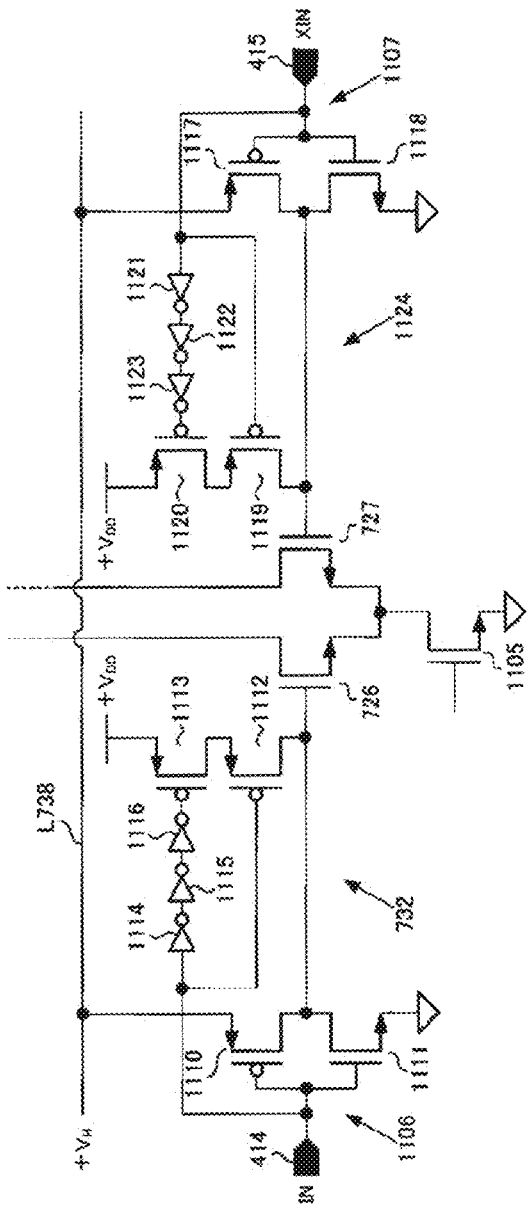

FIGS. 11A and 11B are circuit diagrams of a D/A conversion circuit 1101 according to a second embodiment of the present disclosure.

FIG. 11A is a circuit diagram showing the entire configuration of the D/A conversion circuit 1101. The circuit diagram illustrated in FIG. 11A is basically formed by the polarity exactly opposite to that of FIG. 8A.

A drain of a PMOSFET 1103 forming a source follower is grounded, and a source thereof is connected to a constant current source 1102. The other end of the constant current source 1102 is connected to the power-supply voltage +$V_{DD}$. A constant voltage source 1124 is connected to a gage of the PMOSFET 1103. A gate voltage of the PMOSFET 1103 is controlled to have a constant voltage by the constant voltage source 1124, and the PMOSFET 1103 and the constant current source 1102 generate a switching voltage +$V_H$ that is equal to the gate voltage of the gate voltage. The switching voltage +$V_H$ is supplied to NOT gates 1106 and 1107 via a switching voltage line L738.

The constant voltage source 1124, the constant current source 1102, and the PMOSFET 1103 form a constant voltage circuit. The constant voltage circuit outputs the switching voltage +$V_H$. It should be noted that a capacitor C1104 is connected between the source and the drain of the PMOSFET 1103, but it may not be provided.

The selector switch 103 is formed of NMOSFETs 726a and 727a, and an NMOSFET 1105a forming a constant current source is connected between sources of the NMOSFETs 726a and 727a and GND.

The third switch 732 corresponding to the third switch 707 of FIG. 8A is connected to a gate of the NMOSFET 726a and the power-supply voltage +$V_{DD}$. Similarly, a switch 1124 corresponding to the switch 812 of FIG. 8A is connected to a gate of the NMOSFET 727a and the power-supply voltage +$V_{DD}$.

FIG. 11B is a circuit diagram for specifically describing a circuit surrounded by a dashed-line frame of FIG. 11A.

The NOT gate 1106 is a general CMOS inverter formed by a combination of a PMOSFET 1110 and an NMOSFET 1111 as in the case of FIG. 8B. However, a source of the PMOSFET 1110 is connected not to the power source but to the switching voltage line L738 that supplies +$V_H$. Therefore, the NOT gate 1106 outputs an output voltage of GND when a high potential is applied to the gate and outputs an output voltage of +$V_H$ when a low potential is applied to the gate.

The output terminal (drains of the PMOSFET 1110 and the NMOSFET 1111) of the NOT gate 1106 is connected to the gate of the NMOSFETs 726 and 727 forming the selector switch 103.

A drain of a PMOSFET 1112 is connected to the output terminal of the NOT gate 1106. A drain of another PMOSFET 1113 is connected to a source of the PMOSFET 1112. A source of the PMOSFET 1113 is connected to the power source +$V_{DD}$.

A gate of the PMOSFET 1112 is connected to an input terminal of the NOT gate 1106.

On the other hand, three NOT gates 1114, 1115, and 1116 are connected in series between a gate of the PMOSFET 1113 and the input terminal of the NOT gate 1106. The NOT gates form a short-time delay. Those two PMOSFETs 1112 and 1113 and the three NOT gates 1114, 1115, and 1116 form the third switch 732 of FIG. 7B.

Similarly, a circuit continuous to a NOT gate 1107 connected to the non-inverting input code terminal 415 has a circuit configuration equivalent to the circuit continuous to the NOT gate 1106 connected to the inverting input code terminal 414.

The NOT gate 1107 is formed by a combination of a PMOSFET 1117 and an NMOSFET 1118.

The output terminal of the NOT gate 1107 is connected to the gate of the PMOSFET 727 forming the selector switch 103.

A drain of a PMOSFET 1119 is connected to the output terminal of the NOT gate 1107. A drain of a PMOSFET 1120 is connected to a source of the PMOSFET 1119. A source of the PMOSFET 1120 is connected to the power-supply voltage +$V_{DD}$.

A gate of the PMOSFET 1119 is connected to the non-inverting input code terminal 415.

On the other hand, three NOT gates 1121, 1122, and 1123 are connected in series between a gate of the PMOSFET 1120 and the non-inverting input code terminal 415.

Those two PMOSFETs 1119 and 1120 and the NOT gates 1121, 1122, and 1123 form the switch 1124 of FIG. 11A.

As is understood from the above description, FIGS. 11A and 11B show the circuits that produce completely the same effect as that produced by the circuits of FIGS. 8A and 8B, though the logics are opposite to each other. The effect is to prevent the generation of the glitch noise by discharging the charge accumulated in the parasitic capacitance to the power source.

(Variations of Constant Voltage Source)

Figure 12A:
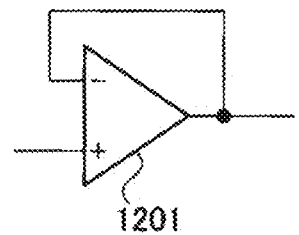
FIGS. 12A, 12B, and 12C are circuit examples showing variations of a constant voltage source.
Figure 12B:
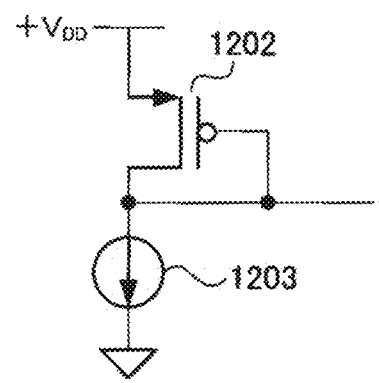
Figure 12C:
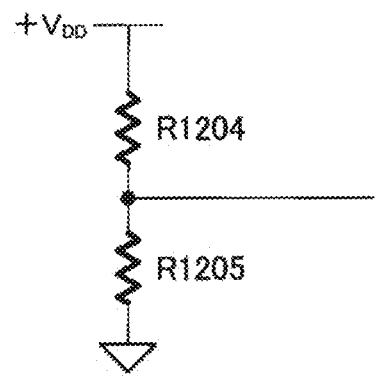

FIGS. 12A, 12B, and 12C are circuit examples showing variations of the constant voltage source.

FIG. 12A is a general voltage follower formed of an operational amplifier 1201.

FIG. 12B is a constant voltage circuit formed of a PMOSFET 1202 and a constant current source 1203. The PMOSFET 1202 forms a constant current diode.

FIG. 12C is a voltage-dividing circuit formed by connecting two resistors R1204 and R1205 in series.

Any one of the circuits has a capability of supplying the switching voltage +$V_L$ or +$V_H$. Those circuits each incorporate an impedance inherently. The impedance is larger than that of the power source inevitably when power saving is considered.

(Third Embodiment)

Embodiments described below are all circuit examples according to the basic concept of FIG. 7A. As is clear from the description above, however, the embodiments described below can also be formed according to the basic concept of FIG. 7B.

Figure 13:
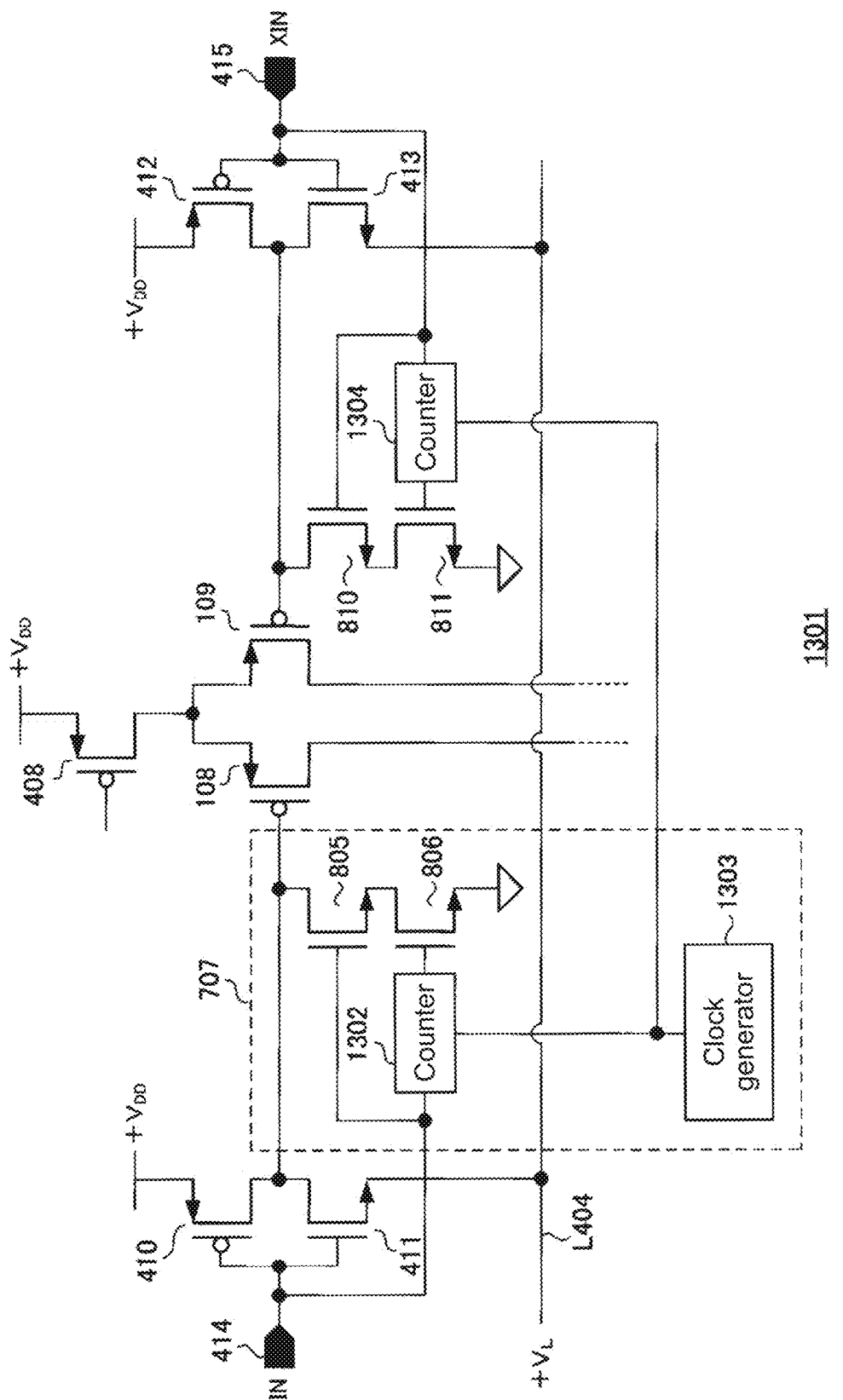
FIG. 13 is a circuit diagram of a D/A conversion circuit according to a third embodiment of the present disclosure.

FIG. 13 is a circuit diagram of a D/A conversion circuit 1301 according to a third embodiment of the present disclosure. The circuit shown in FIG. 13 can be replaced with the circuit of FIG. 8B. The same constituent elements of FIG. 13 as those of FIG. 8B are denoted by the same reference symbols and description thereof will be omitted.

A counter 1302 is connected to the gate of the NMOSFET 806 forming the third switch 707. The counter 1302 is connected to a reference clock generator 1303 of a frequency higher than a sampling clock as a reference of an input code signal and to the code input terminal. The counter 1302 starts to count the number of pulses output by the reference clock generator 1303 and simultaneously outputs "true" of the logic, that is, a high potential, at the rising edge of an input signal input from the code input terminal. Then, when a predetermined number of pulses is counted, the counter 1302 outputs "false" of the logic, that is, a low potential. The number of pulses to be counted by the counter is determined as a design matter as in the first embodiment described above.

In other words, the counter 1302 and the reference clock generator 1303 perform an operation equivalent to that of the delay circuit formed of the first NOT gate 802, the second NOT gate 803, and the third NOT gate 804 shown in FIGS. 8B and 9A.

Similarly, a counter 1304 and the reference clock generator 1303 perform an operation equivalent to that of the delay circuit formed of the NOT gates 807, 808, and 809 shown in FIG. 8B.

(Fourth Embodiment)

Figure 14:
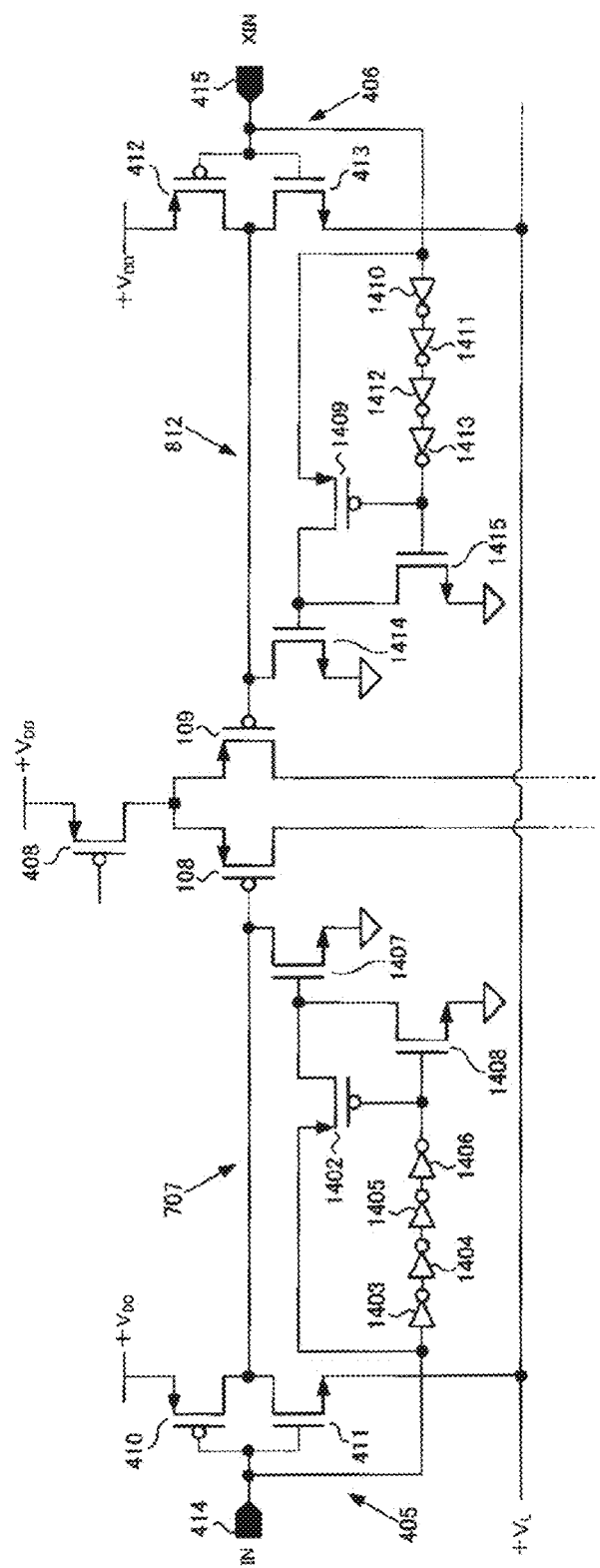
FIG. 14 is a circuit diagram of a D/A conversion circuit according to a fourth embodiment of the present disclosure.

FIG. 14 is a circuit diagram of a D/A conversion circuit 1401 according to a fourth embodiment of the present disclosure. The circuit shown in FIG. 14 can be replaced with the circuit of FIG. 8B. The same constituent elements of FIG. 14 as those of FIG. 8B are denoted by the same reference symbols and description thereof will be omitted.

A source of a PMOSFET 1402 is connected to the inverting input code terminal 414 connected to the input of the NOT gate 405.

Four NOT gates 1403, 1404, 1405, and 1406 connected in series are connected between the source and a gate of the PMOSFET 1402 and function as a delay circuit similarly to the first NOT gate 802, the second NOT gate 803, and the third NOT gate 804 shown in FIGS. 8B and 9A.

A gate of an NMOSFET 1407 and a drain of an NMOSFET 1408 are connected to the drain of the PMOSFET 1402.

A drain of the NMOSFET 1407 is connected to the gate of the PMOSFET 108, and a source thereof is connected to GND.

A gate of the NMOSFET 1408 is connected to the gate of the PMOSFET 1402, and a source thereof is connected to GND.

When the inverting input code terminal 414 is at a low potential, the PMOSFET 1402 and the NMOSFETs 1407 and 1408 are all in off-state.

When the inverting input code terminal 414 changes from a low potential to a high potential, the PMOSFET 1402 enters on-state only for a period of time provided by the four NOT gates 1403, 1404, 1405, and 1406 connected in series. Then, until the NMOSFET 1408 connected to the NOT gate 1406 enters on-state, the NMOSFET 1407 connected to the control line L902 is turned on. Then, when the gate of the NMOSFET 1408 connected to the NOT gate 1406 is at a high potential, the NMOSFET 1408 enters on-state, and the gate potential of the NMOSFET 1407 connected to the control line L902 drops to GND, and thus the NMOSFET 1407 is turned off.

Specifically, the NOT gates 1403, 1404, 1405, and 1406, the PMOSFET 1402, and the NMOSFETs 1407 and 1408 form the third switch 707.

Similarly, NOT gates 1410, 1411, 1412, and 1413, a PMOSFET 1409, and NMOSFETs 1414 and 1415 form the switch 812.

Thus, variations of the circuit forming the third switch 707 and the switch 812 are conceived.

(Fifth Embodiment)

FIGS. 15A and 15B are circuit diagrams of a D/A conversion circuit 1501 according to a fifth embodiment of the present disclosure. The same constituent elements of FIGS. 15A and 15B as those of FIGS. 8A and 8B are denoted by the same reference symbols and description thereof will be omitted.

FIG. 15A is a circuit diagram showing the entire configuration of the D/A conversion circuit 1501.

A comparator 1502 using a fully-differential amplifier is connected to the gates of the PMOSFETs 108a and 109a forming the selector switch 103. The comparator 1502 receives an input of a code signal from the code input terminal 113 and an input of a reference voltage Vref from a reference voltage input terminal 1503 and also receives supply of the switching voltage $+V_L$ from a constant voltage source (not shown), to output a square wave logic signal formed of the potentials of $+V_{DD}$ and $+V_L$. Specifically, the comparator 1502 performs an operation equivalent to that of the PMOSFET 410 and the NMOSFET 411 forming the NOT gate 405 and that of the PMOSFET 412 and the NMOSFET 413 forming the NOT gate 406 shown in FIGS. 8A and 8B.

In the case where the fully-differential amplifier is formed of MOSFETs, the MOSFETs may be a factor of generation of the glitch noise described with reference to FIGS. 5A, 5B, and 6. At that time, if the third switch 707 involving a delay equivalent to that of FIG. 8B is provided as in this embodiment, the glitch noise can be reduced.

The present disclosure can have the following configurations.

(1) A digital-to-analog conversion circuit, including:
a plurality of current generation circuits each including
a constant current source configured to generate a current corresponding to a predetermined parameter,
a first metal-oxide semiconductor field-effect transistor (MOSFET) that is connected to the constant current source and is configured to control a supply destination of the current,
a first gate control section configured to exclusively supply a first voltage and a second voltage to control the first MOSFET, the first MOSFET being controlled to be turned off by the first voltage and turned on by the second voltage,
a discharge line configured to discharge charge accumulated in a parasitic capacitance that exists in the first gate control section and the gate of the first MOSFET, and
a first discharge switch that is connected to the first gate control section and the gate of the first MOSFET, is controlled to be turned on at the same time as the first gate control section supplies the second voltage to discharge the charge to the discharge line, and is controlled to be turned off before the first gate control section supplies the first voltage;
a first current addition line, to which the first MOSFETs are connected in parallel;
a first resistor connected to the first current addition line at a predetermined potential; and
a voltage source configured to supply the second voltage to the first gate control sections.

(2) The digital-to-analog conversion circuit according to (1), in which the plurality of current generation circuits each include
a second MOSFET that is connected to the constant current source and is configured to exclusively control the supply destination of the current for the first MOSFET,
a second gate control section configured to exclusively supply the first voltage and the second voltage to control the second MOSFET, the second MOSFET being controlled to be turned off by the first voltage and turned on by the second voltage, and
a second discharge switch that is connected to the second gate control section and a gate of the second MOSFET, is controlled to be turned on at the same time as the second gate control section supplies the second voltage to discharge the charge to the discharge line, and is controlled to be turned off before the second gate control section supplies the first voltage,
the digital-to-analog conversion circuit further including:
a second current addition line, to which the second MOSFETs are connected in parallel; and
a second resistor connected to the second current addition line at a predetermined potential,
in which the voltage source is configured to supply the second voltage to the second gate control sections.

(3) The digital-to-analog conversion circuit according to (2), in which
at least one of the first current addition line and the second current addition line is used as an digital-to-analog conversion output, and
the voltage source has an impedance higher than that of the first discharge switch.
(4) The digital-to-analog conversion circuit according to (3), in which
each of the first MOSFET and the second MOSFET includes a P-channel MOSFET,
the first voltage includes a positive power-supply voltage, and
the second voltage includes a voltage higher than GND.
(5) The digital-to-analog conversion circuit according to (3), in which
each of the first MOSFET and the second MOSFET includes an N-channel MOSFET,
the first voltage includes GND, and
the second voltage includes a voltage lower than a positive power-supply voltage.

In this embodiment, the D/A conversion circuit has been disclosed.

In order to discharge the charge accumulated in the capacitor C520 as the parasitic capacitance, which is a cause of generation of the glitch noise, the third switch 707 is provided at the gates of the PMOSFETs 108a and 109a forming the selector switch 103. The third switch 707 is turned on at the same time as the second switch 705 is turned on, and then immediately turned off. Then, the charge accumulated in the capacitor C520 as the parasitic capacitance is discharged to the discharge line L708 via the third switch 707. In other words, the third switch 707 is turned on or off only for the purpose of discharging the charge accumulated in the capacitor C520 as the parasitic capacitance.

The addition of the third switch 707 allows the charge accumulated in the capacitor C520 as the parasitic capacitance to be discharged instantly to the discharge line L708. Therefore, the phenomenon that a voltage of the switching voltage line L404 rises to a voltage close to the first voltage can be prevented from occurring, and thus the generation of the glitch noise can be prevented.

Hereinabove, the embodiments of the present disclosure have been described. However, the present disclosure is not limited to the embodiments described above and includes other modified examples and application examples without departing from the gist of the present disclosure described in the section "What is claimed is".

For example, in the embodiments above, the apparatus and the system configuration have been described in detail and concretely in order to describe the present disclosure to be easily understandable and are not necessarily limited to embodiments including all the configurations described herein. Further, a part of the configuration of one of the embodiments can be replaced with the configuration of another embodiment. Furthermore, the configuration of one of the embodiments can be added to the configuration of another embodiment. Additionally, a part of the configuration of each embodiment can be provided with another configuration, deleted, and replaced therewith.

Further, the above-mentioned configurations, functions, processing sections, and the like may be achieved with hardware by designing part or all of the configurations, functions, processing sections, and the like by use of integrated circuits, for example. Further, the above-mentioned configurations, functions, and the like may be achieved with software for translating and executing programs with which a processor achieves the respective functions. Information including the programs for achieving the functions, tables, files, and the like can be stored in volatile or non-volatile storages such as a memory, a hard disk, and a solid state drive (SSD) or recording media such as an integrated circuit (IC) card and an optical disc.

Further, the control lines and information lines that are assumed to be necessary for the description are described, and all of the control lines and information lines are not necessarily described depending on products. Actually, almost all the configurations may be considered to be connected to one another.

It should be understood by those skilled in the art that various modifications, combinations, sub-combinations and alterations may occur depending on design requirements and other factors insofar as they are within the scope of the appended claims or the equivalents thereof.

What is claimed is:

1. A digital-to-analog conversion circuit, comprising:
   a plurality of current generation circuits each including
      a constant current source configured to generate a current corresponding to a predetermined parameter,
      a first metal-oxide semiconductor field-effect transistor (MOSFET) that is connected to the constant current source and is configured to control a supply destination of the current,
      a first gate control section configured to exclusively supply a first voltage and a second voltage to a gate of the first MOSFET to control the first MOSFET, the first MOSFET being controlled to be turned off by the first voltage and turned on by the second voltage, and
      a first discharge switch that is connected to the first gate control section and the gate of the first MOSFET, is controlled to be turned on at the same time as the first gate control section supplies the second voltage to discharge charge accumulated in a parasitic capacitance to a predetermined target, the parasitic capacitance being in the first gate control section and the gate of the first MOSFET, and is controlled to be turned off before the first gate control section supplies the first voltage;
   a first current addition line, to which the first MOSFETs are connected in parallel;
   a discharge line configured to discharge the charge;
   a first resistor connected to the first current addition line at a predetermined potential; and
   a voltage source configured to supply the second voltage to the first gate control sections.

2. The digital-to-analog conversion circuit according to claim 1,
   wherein the plurality of current generation circuits each include
      a second MOSFET that is connected to the constant current source and is configured to exclusively control the supply destination of the current for the first MOSFET,
      a second gate control section configured to exclusively supply the first voltage and the second voltage to control the second MOSFET, the second MOSFET being controlled to be turned off by the first voltage and turned on by the second voltage, and
      a second discharge switch that is connected to the second gate control section and a gate of the second MOSFET, is controlled to be turned on at the same time as the second gate control section supplies the second voltage to discharge charge accumulated in a parasitic capacitance to the discharge line, the parasitic capacitance being in the second gate control section and the gate of the second MOSFET, and is controlled to be turned off before the second gate control section supplies the first voltage, the digital-to-analog conversion circuit further comprising:

a second current addition line, to which the second MOSFETs are connected in parallel; and a second resistor connected to the second current addition line at a predetermined potential, wherein the voltage source is configured to supply the second voltage to the second gate control sections.

3. The digital-to-analog conversion circuit according to claim 2, wherein at least one of the first current addition line and the second current addition line is used as an digital-to-analog conversion output, and the voltage source has an impedance higher than that of the first discharge switch.

4. The digital-to-analog conversion circuit according to claim 3, wherein each of the first MOSFET and the second MOSFET includes a P-channel MOSFET, the first voltage includes a positive power-supply voltage, the second voltage includes a voltage higher than a ground potential, and the discharge line includes ground.

5. The digital-to-analog conversion circuit according to claim 3, wherein each of the first MOSFET and the second MOSFET includes an N-channel MOSFET, the first voltage includes a ground potential, the second voltage includes a voltage lower than a positive power-supply voltage, and the discharge line includes a positive supply terminal.

* * * * *